(12) United States Patent
Nakamoto et al.

(10) Patent No.: US 7,936,509 B2
(45) Date of Patent: May 3, 2011

(54) WAVELENGTH LOCKER

(75) Inventors: Kenichi Nakamoto, Kawasaki (JP); Kazuyuki Mori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 710 days.

(21) Appl. No.: 11/636,619

(22) Filed: Dec. 11, 2006

(65) Prior Publication Data

US 2008/0049316 A1  Feb. 28, 2008

(30) Foreign Application Priority Data

Aug. 25, 2006 (JP) .................................. 2006-229708

(51) Int. Cl.
G02B 5/30 (2006.01)
(52) U.S. Cl. ........... 359/495; 359/497; 359/499; 372/20
(58) Field of Classification Search .................. 359/495, 359/497, 499; 372/9, 20
See application file for complete search history.

(56) References Cited

U.S. PATENT DOCUMENTS

| | | | |
|---|---|---|---|
| 6,339,603 B1 * | 1/2002 | Flanders et al. ............... 372/20 |
| 6,404,549 B1 * | 6/2002 | Huang et al. .................. 359/484 |
| 6,455,841 B2 * | 9/2002 | Zhou et al. .................... 250/225 |
| 6,477,189 B1 | 11/2002 | Takeda et al. |
| 6,549,548 B2 * | 4/2003 | Kuznetsov et al. ............. 372/32 |
| 6,597,712 B2 * | 7/2003 | Tatsuno et al. ................. 372/32 |
| 6,611,342 B2 * | 8/2003 | Patel et al. ..................... 356/519 |
| 6,904,067 B2 * | 6/2005 | Colin et al. ................ 372/29.02 |
| 7,039,261 B2 * | 5/2006 | Fu et al. ......................... 385/11 |
| 7,061,947 B2 * | 6/2006 | Short .......................... 372/29.02 |
| 7,102,120 B2 * | 9/2006 | Komiyama ................... 250/225 |
| 7,372,612 B2 * | 5/2008 | Chu ............................... 359/285 |
| 2002/0126386 A1 * | 9/2002 | Jordan et al. .................. 359/577 |
| 2003/0173505 A1 * | 9/2003 | Wipiejewski ................. 250/226 |
| 2004/0228373 A1 | 11/2004 | Tatsuno et al. |
| 2005/0051712 A1 | 3/2005 | Komiyama |

FOREIGN PATENT DOCUMENTS

| | | |
|---|---|---|
| JP | 2001-13379 | 1/2001 |
| JP | 2001-36189 | 2/2001 |
| JP | 2001-244557 | 9/2001 |
| JP | 2002-252413 | 9/2002 |
| JP | 2004-055974 | 2/2004 |
| JP | 2004-119721 | 4/2004 |
| JP | 2005-85904 | 3/2005 |

OTHER PUBLICATIONS

Japanese Office Action issued Mar. 1, 2011 in corresponding Japanese Patent Application 2006-229708.

* cited by examiner

*Primary Examiner* — Ricky D Shafer
(74) *Attorney, Agent, or Firm* — Staas & Halsey LLP

(57) ABSTRACT

A wavelength locker includes: a birefringent plate for separating light emitted from a light source into two beams of light which are approximately in parallel to each other; a first light receiving element for directly receiving one of the two beams of light separated by the birefringent plate; a λ/4 plate and an etalon filter through which other one of the two beams of light separated by the birefringent plate passes; and a second light receiving element for receiving the other one of the two beams of light which has passed through the etalon filter. The λ/4 plate has an optic axis tilted at 45 degrees with respect to a polarization direction of light incident on the λ/4 plate, changes a polarization direction of light, which has been reflected by the etalon filter and incident on the λ/4 plate, such that the reflected light does not return to the light source after passing through the birefringent plate, and emits the resultant light.

10 Claims, 24 Drawing Sheets

WAVELENGTH LOCKER

BACKGROUND OF THE INVENTION

1. Field of the Invention

The present invention relates to a technique concerning a wavelength locker used for optical communications, and more particularly, to a wavelength locker used in an LD module which requires high-precision wavelength stability for, e.g., Dense Wavelength Division Multiplexing (DWDM) communications.

2. Description of the Related Art

In Wavelength Division Multiplexing (WDM) communications, multiple beams of signal light are transmitted at predetermined signal wavelength intervals. Thus, it is necessary to have adequate isolation from signal light of adjacent wavelengths. As the signal wavelength interval becomes shorter, higher precision control needs to be applied to the output wavelengths of signal-light light sources. In WDM communication systems, wavelength lockers are used, which suppress wavelength fluctuation caused by fluctuation over time or fluctuation of surrounding temperature of laser diode (LD) light sources, and lock the outputted light beams at specified wavelengths with high precision.

With increased data traffic of recent years, high-speed high-capacity communications become fundamental. Development of high-capacity photonic networks using DWDM has been in progress. For an optical transmitting and receiving device used for DWDM, compact pluggable modules conforming to MSA (Multi Source Agreement), such as XFP (10 Gigabit Small Form Factor Pluggable) and SFP (Small Form-Factor Pluggable), have been increasingly developed. TOSA (Transmitter Optical Sub Assembly) LD (Laser Diode) modules to be incorporated in the compact pluggable modules are very compact. In order to support DWDM and tunable LDs, a wavelength locker needs to be incorporated in TOSA. However, it is impossible to incorporate the wavelength locker having a conventional structure in TOSA. Therefore, there is an urgent need to develop amore compact wavelength locker.

FIG. 24 is a diagram showing a structure of a conventional wavelength locker. In the wavelength locker shown in FIG. 24, backward light emitted by an LD serving as a light emitting element (light source) is collimated by a lens and separated by a half mirror. One of beams of the light separated is directly received by a PD (photo diode) 1 serving as a light receiving element. The other one of the beams is received by a PD 2 after passing through an etalon filter. The etalon filter has wavelength-dependent transmission property. Accordingly, it is possible to keep the wavelength of outputted light to be incident on an optical fiber constant by controlling the oscillation wavelength of the LD such that a ratio of light-receiving powers of the PD 1 and the PD 2 becomes constant.

However, with the structure of the conventional wavelength locker, a space optical system becomes large because the half mirror separates light into beams that are perpendicular to each other. Further, since the PD 1 and the PD 2 are perpendicularly aligned, amounting area becomes large. In addition, it is necessary to tilt the etalon filter to prevent light reflected by an end surface of the etalon filter from returning to the LD, leading to enlargement of the mounting area. Consequently, a limitation resides in miniaturization of the wavelength locker, so the conventional wavelength locker cannot be incorporated in TOSA to be mounted to the compact pluggable modules such as XFP.

Note that prior art documents of the present invention include the following Patent documents.

[Patent document 1] JP 2005-85904 A
[Patent document 2] JP 2004-119721 A
[Patent document 3] JP 2004-55974 A

SUMMARY OF THE INVENTION

An object of the present invention is to provide a compact wavelength locker which can be incorporated in, for example, a TOSA LD-module mounted to a compact pluggable module.

The present invention employs the following means in order to solve the problems described above.

To be specific, a wavelength locker according to a first aspect of the present invention includes:

a birefringent plate for separating light emitted from a light source into two beams of light which are approximately in parallel to each other;

a first light receiving element for directly receiving one of the two beams of light separated by the birefringent plate;

a polarizing element and a filter element through which another of the two beams of light separated by the birefringent plate passes; and a second light receiving element for receiving the other one of the two beams of light which has passed through the filter element, in which the polarizing element changes a polarization direction of light reflected by the filter element and incident on the polarizing element such that the reflected light does not return to the light source after passing through the birefringent plate, and emits the resultant light.

It is preferable that the wavelength locker according to the first aspect of the present invention further include a second polarizing element disposed between the light source and the birefringent plate, for changing a polarization direction of the light, which has been emitted from the light source, reflected by the birefringent plate, and incident on the second polarizing element, to a direction perpendicular to the polarization direction of the emitted light, and for emitting the resultant light.

A wavelength locker according to a second aspect of the present invention includes:

a birefringent plate for separating light emitted from a light source into two beams of light which are approximately in parallel to each other;

a first light receiving element for directly receiving one of the two beams of light separated by the birefringent plate;

a filter element through which the other one of the two beams of light separated by the birefringent plate passes; and a second light receiving element for receiving the other one of the two beams of light which has passed through the filter element, in which the filter element is tilted with respect to an optical axis of the other one of the two beams of light.

It is preferable that the wavelength locker according to the second aspect of the present invention further include a polarizing element disposed between the light source and the birefringent plate, for changing a polarization direction of the light, which has been emitted from the light source, reflected by the birefringent plate, and incident on the polarizing element, to a direction perpendicular to the polarization direction of the emitted light, and for emitting the resultant light.

A wavelength locker according to a third aspect of the present invention includes:

a branching element for separating light emitted from a light source into first light and second light;

a reflecting element for reflecting and causing one of the first light and the second light to be in parallel to the other one of the first light and the second light;

a polarizing element and a filter element which are inserted in an optical path of one of the first light and the second light;

a first light receiving element for receiving light on an optical path in which the polarizing element and the filter element are not inserted; and a second light receiving element for receiving light that has passed through the polarizing element and the filter element, in which the polarizing element changes a polarization direction of light which has been reflected by the filter element and incident on the polarizing element, such that the reflected light has less influence on the light source than the reflected light that returns to the light source without passing through the polarizing element, and emits a resultant light.

A wavelength locker according to a fourth aspect of the present invention includes:

a branching element for separating light emitted from a light source into first light and second light;

a reflecting element for reflecting and causing one of the first light and the second light to be in parallel to the other one of the first light and the second light;

a filter element inserted in an optical path of one of the first light and the second light;

a first light receiving element for receiving light on an optical path in which the filter element is not inserted; and a second light receiving element for receiving light that has passed through the filter element, in which the filter element is tilted with respect to an optical axis of light traveling straight on an optical path in which the filter element is inserted.

In the first aspect of the present invention, it is preferable that: the birefringent plate has an optic axis tilted at 45 degrees with respect to a polarization direction of light incident on the birefringent plate; and the polarizing element is a λ/4 plate having an optic axis tilted at 45 degrees with respect to a polarization direction of light incident on the polarizing element.

In the second aspect of the present invention, it is preferable that the second polarizing element is a λ/4 plate having an optic axis tilted at 45 degrees with respect to a polarization direction of light incident on the second polarizing element.

In the second aspect of the present invention, it is preferable that the polarizing element is a λ/4 plate having an optic axis tilted at 45 degrees with respect to a polarization direction of light incident on the polarizing element.

In the third and fourth aspects of the present invention, it is preferable that the polarizing element is a λ/4 plate having an optic axis tilted at 45 degrees with respect to a polarization direction of light incident on the polarizing element.

EFFECTS OF THE INVENTION

According to the present invention, the wavelength locker can be made compact, which makes it possible to incorporate the wavelength locker into a TOSA LD-module which is mounted to a compact pluggable module, for example.

DETAILED DESCRIPTION OF THE PREFERRED EMBODIMENTS

Hereinafter, embodiments of the present invention are described with reference to the drawings. The embodiments show just example structures, and the present invention is not limited to the structures of the embodiments.

First Embodiment

Structure

Figure 1:
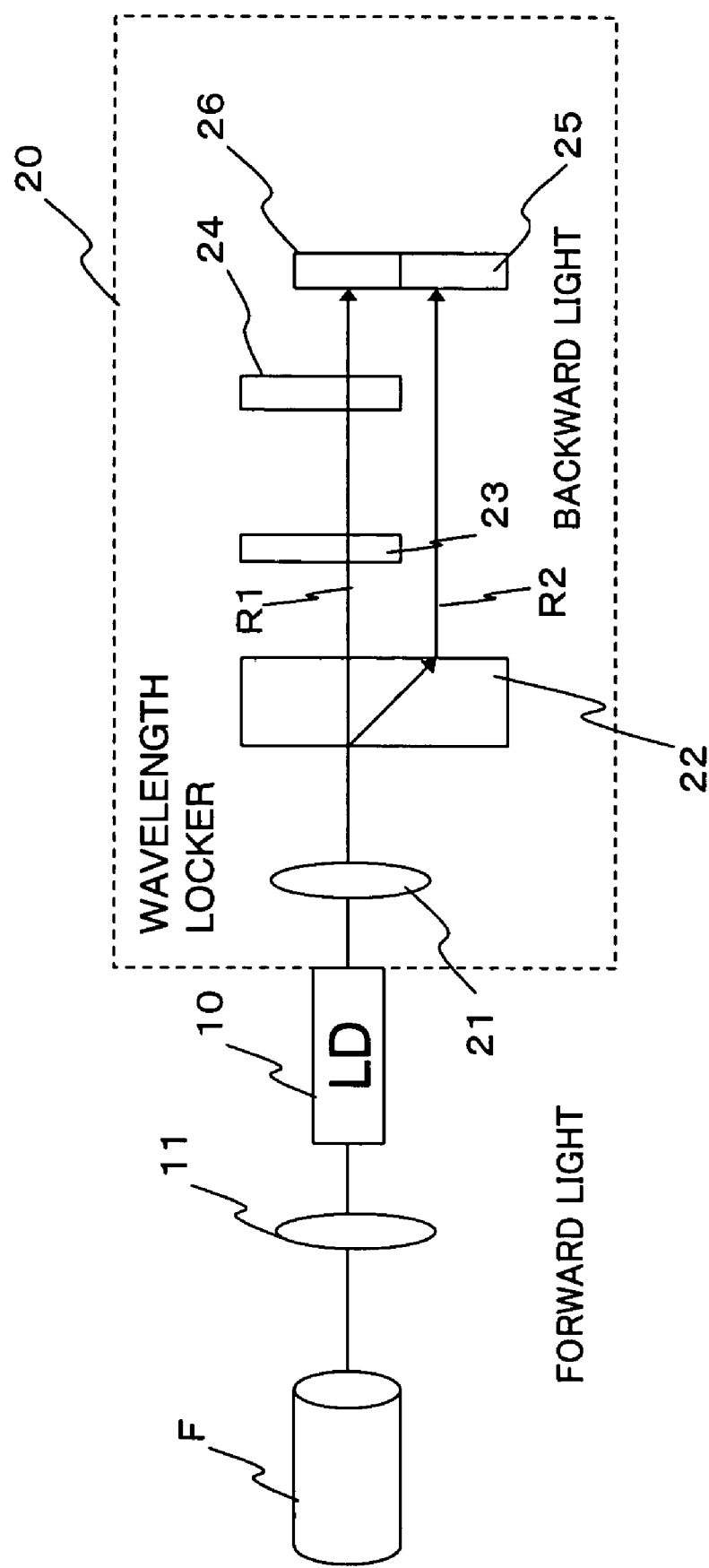
FIG. 1 is a diagram showing an example structure of a wavelength locker according to a first embodiment of the present invention.

FIG. 1 is a diagram showing an example structure of a wavelength locker according to a first embodiment of the present invention. FIG. 1 shows an LD module including the wavelength locker of the first embodiment. In FIG. 1, the LD module includes an LD 10 serving as a light source, a lens 11 disposed in front of the LD 10, and a wavelength locker 20 disposed in back of the LD 10 in order to improve oscillation stability of the LD 10.

The LD 10 emits forward and backward light having a specific wavelength, which is to be used as signal light. The lens 11 collimates the forward light emitted from the LD 10 and causes the collimated light to be incident on an end surface of an optical fiber F. The forward light caused to be incident on the optical fiber F is transmitted as the signal light.

The wavelength locker 20 includes a lens 21, a birefringent plate 22, λ/4 plate 23 serving as a polarizing element, an etalon filter 24 serving as a filter element, and a first PD 25 and a second PD 26 serving as first and second light receiving elements (monitors), which are arranged in the stated order from the emitting surface of the backward light emitted by the LD 10 in a direction of the optical axis of the backward light collimated by the lens 21. More specifically, the PDs 25 and 26 are arranged in parallel in a direction approximately perpendicular to the optical axis of the backward light. The PD 25 is disposed at a position so as to directly receive light emitted from a first emitting point of the birefringent plate 22, and the PD 26 is disposed at a position so as to receive light emitted from a second emitting point of the birefringent plate 22 and passing through the λ/4 plate 23 and the etalon filter 24. The optic axis of the birefringent plate 22 is tilted at 45 degrees with respect to the polarization direction of light (inputted light) incident on the birefringent plate 22. The optic axis of the λ/4 plate 23 is tilted at 45 degrees with respect to the polarization direction of light (inputted light) incident on the λ/4 plate 23.

<Operation>

In the wavelength locker 20, the backward light emitted from the LD 10 is collimated by the lens 21 and is incident on the birefringent plate 22. Due to the birefringence of the birefringent plate 22, the inputted light is separated into two beams of light, i.e., ordinary light R1 and extraordinary light R2, which have different polarization states (polarization directions thereof are perpendicular to each other). The ordinary light R1 travels straight in the birefringent plate 22 and is emitted from the first emitting point. On the other hand, the extraordinary light R2 is refracted in the birefringent plate 22 and emitted from the second emitting point which is shifted from the first emitting point by a predetermined distance. Accordingly, two beams of light which are substantially in parallel with the predetermined distance provided therebetween are emitted from the birefringent plate 22.

One (in FIG. 1, the extraordinary light R2) of the two beams is directly received by the PD 25. The other one (in FIG. 1, the ordinary light R1) is received by the PD 26 after passing through the λ/4 plate 23 and the etalon filter 24. The wavelength locker 20 and the LD 10 are mounted to an external control circuit board, although not shown in FIG. 1. The control circuit calculates a ratio between power of light received by the PD 25 and power of light received by the PD 26, and performs feedback control of the oscillation wavelength of the LD 10 such that the ratio becomes constant. With this operation, the oscillation wavelength of the LD 10 can be stabilized.

Figure 2:
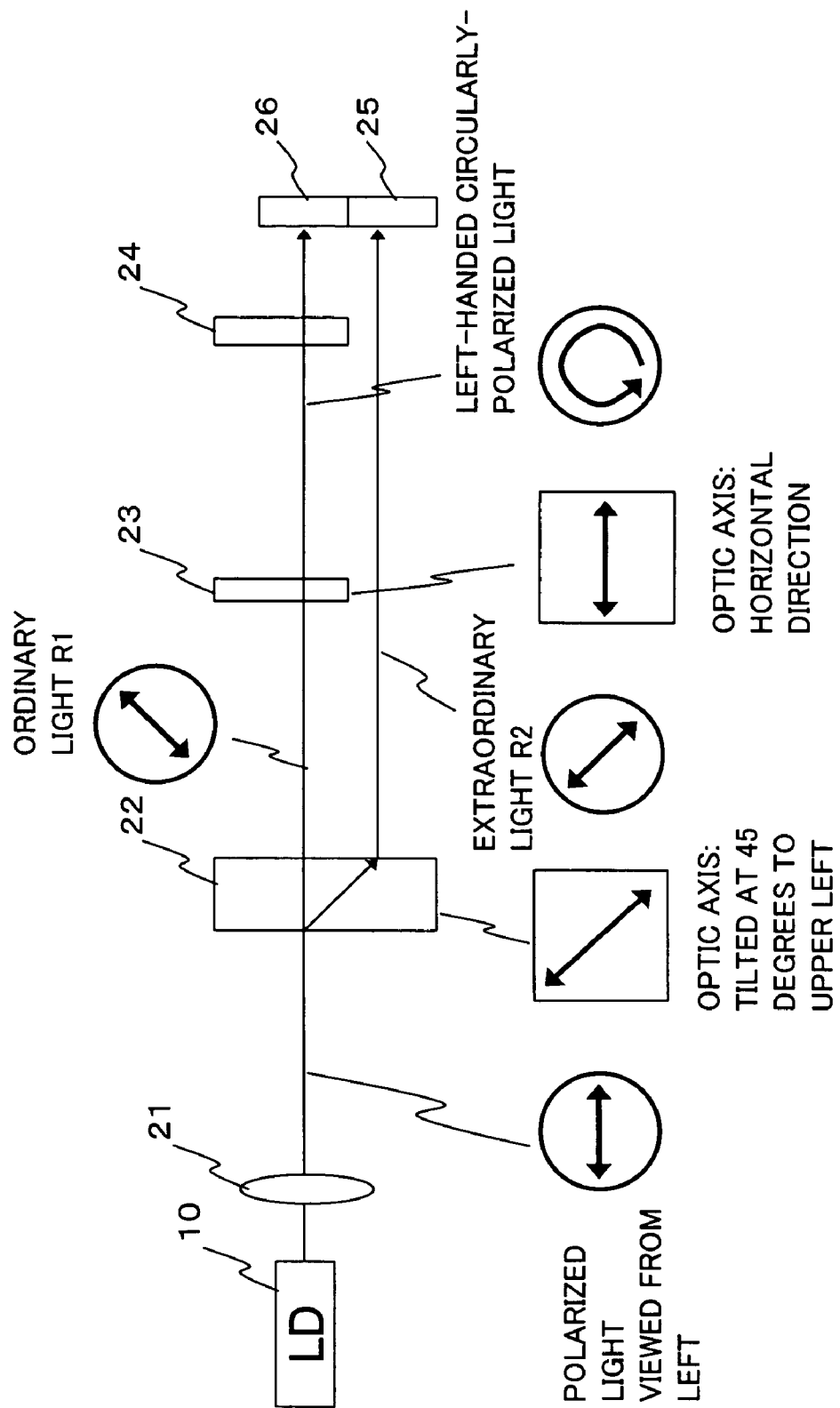
FIG. 2 is a diagram for explaining a polarization direction of backward light emitted from an LD, in the wavelength locker shown in FIG. 1.
Figure 3:
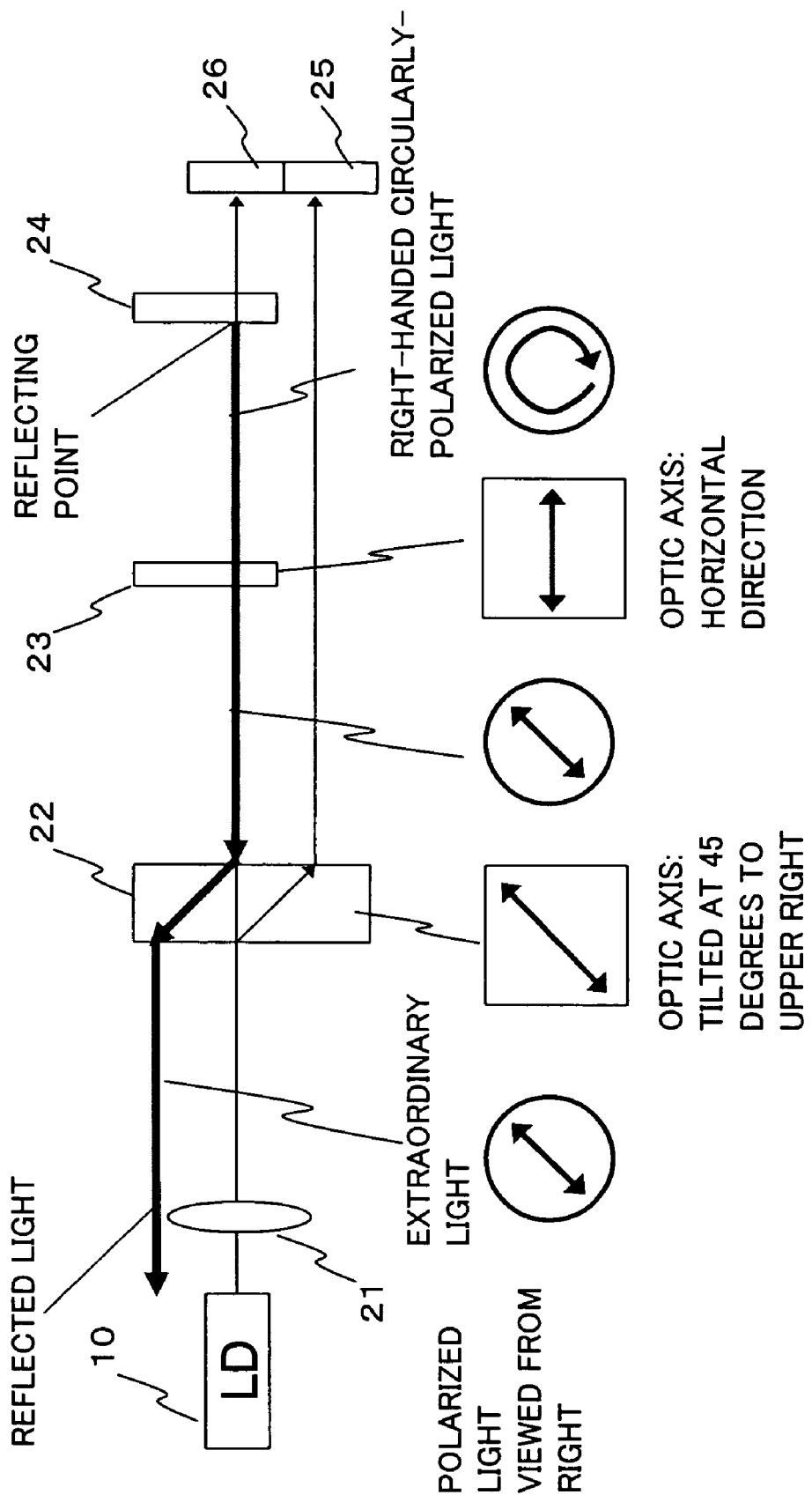
FIG. 3 is a diagram for explaining a polarization direction of light reflected by an etalon filter in the wavelength locker shown in FIG. 1.

Further, the wavelength locker 20 is structured such that light reflected by an end surface of the etalon filter 24 does not return to the LD 10 so as to suppress the influence of the reflected light on the LD 10. FIG. 2 is a diagram showing a polarization state of the backward light in the wavelength locker 20 shown in FIG. 1. FIG. 3 is a diagram showing a polarization state of light reflected by the end surface of the etalon filter 24.

As shown in FIG. 2, the backward light outputted from the LD 10 is TE-polarized (horizontally polarized) light and is incident on the birefringent plate 22. The optic axis of the birefringent plate 22 is tilted at 45 degrees with respect to the polarization direction of the inputted light. In FIG. 2, the optic axis of the birefringent plate 22 is tilted at 45 degrees to the upper left when viewed from the left side of the figure. Accordingly, the light inputted to the birefringent plate 22 is separated into the ordinary light R1 and the extraordinary light R2, whose polarization directions are perpendicular to each other, and the ordinary light R1 and the extraordinary light R2 are emitted from the first emitting point and the second emitting point, respectively.

The ordinary light R1 is incident on the λ/4 plate 23. The optic axis of the λ/4 plate 23 is tilted at 45 degrees with respect to the polarization direction of the inputted light (in FIG. 2, in a horizontal direction). Accordingly, the ordinary light R1 is emitted from the λ/4 plate 23 as left-handed circularly-polarized light viewed from the left side of the figure.

As shown in FIG. 3, when reflected by the end surface of the etalon filter 24, the left-handed circularly-polarized light becomes right-handed circularly-polarized light viewed from the right side of the figure, and the right-handed circularly-polarized light travels back through the optical path of the ordinary light R1 and is incident on the λ/4 plate 23. The reflected light becomes linearly-polarized light tilted at 45 degrees to the upper right viewed from the right side of the figure when passing through the λ/4 plate 23 and is incident on the birefringent plate 22.

The reflected light (inputted light) incident on the birefringent plate 22 operates as extraordinary light because the polarization direction thereof matches the optic axis of the birefringent plate 22 and is refracted in the birefringent plate 22. Accordingly, the reflected light is emitted from a position which is shifted from the point where the backward light is incident on the birefringent plate 22 by a predetermined distance, and is not incident on the LD 10. As described above, since the reflected light is prevented from returning to the LD 10, an adverse effect on the wavelength-lock precision of the wavelength locker 20 can be suppressed.

<Effects>

Figure 24:
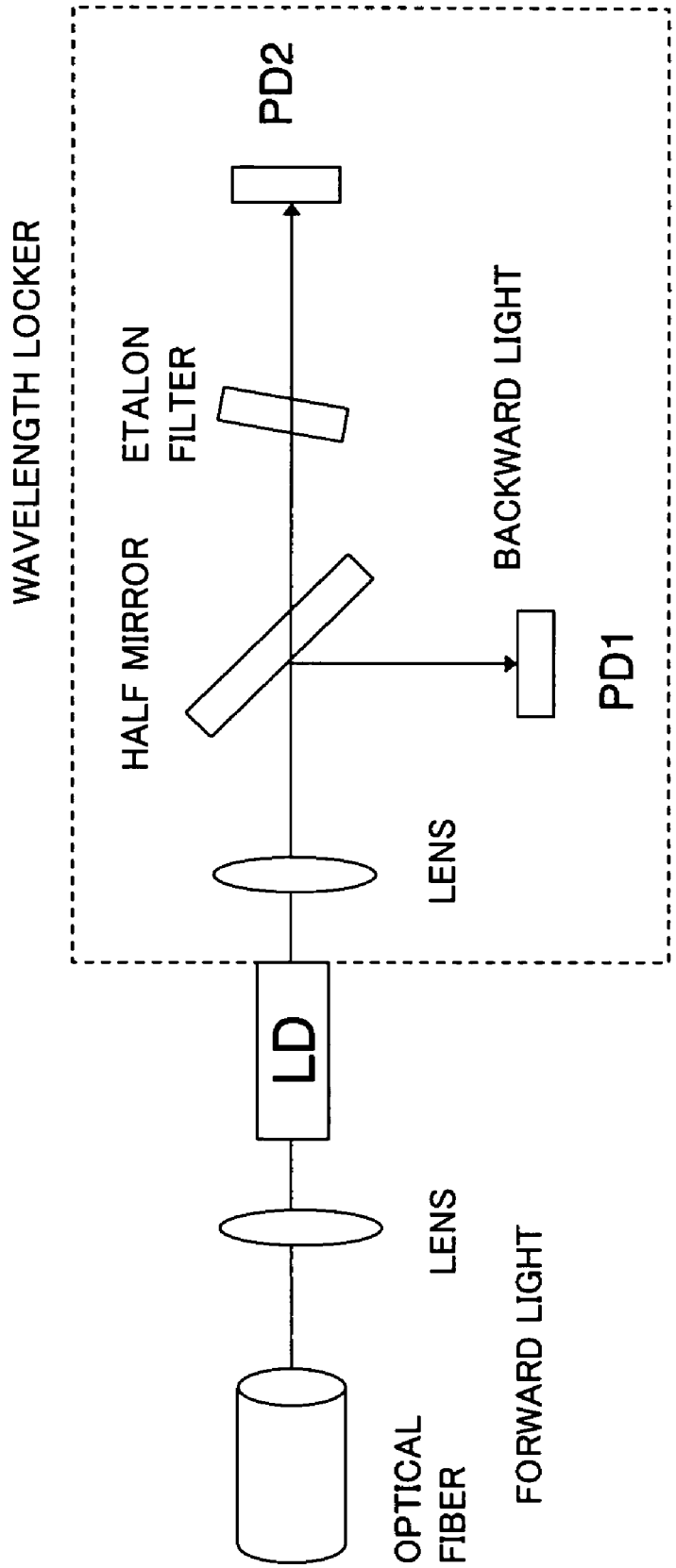
FIG. 24 is a diagram showing an example structure of a wavelength locker as a prior art.

According to the wavelength locker 20 of the first embodiment, both the ordinary light R1 and the extraordinary light R2, which are separated by the birefringent plate 22, travel straight after being emitted from the birefringent plate 22. Therefore, a space optical system can be reduced compared with the prior art (FIG. 24).

In addition, according to the wavelength locker 20, a PD array in which two PDs are integrated can be used as the PDs 25 and 26. Accordingly, a mounting area can be reduced compared with the prior art (FIG. 24).

Further, according to the wavelength locker 20, light reflected by the end surface of the etalon filter 24 is prevented from returning to the LD 10. Accordingly, it is not necessary to tilt the etalon filter 24 with respect to the optical axis direction (direction in which light travels). Therefore, the space optical system can be reduced.

As described above, the wavelength locker 20 can be made more compact than the prior art (FIG. 24), so the wavelength locker 20 can be mounted to a TOSA LD-module.

<Modifications>

The wavelength locker 20 of the first embodiment can be modified in the following way. In FIG. 1, the λ/4 plate 23 and the etalon filter 24 are inserted in the optical path of the ordinary light R1 separated by the birefringent plate 22. Instead of this structure, a structure can be used in which the λ/4 plate 23 and the etalon filter 24 are inserted in the optical path of the extraordinary light R2.

Figure 4:
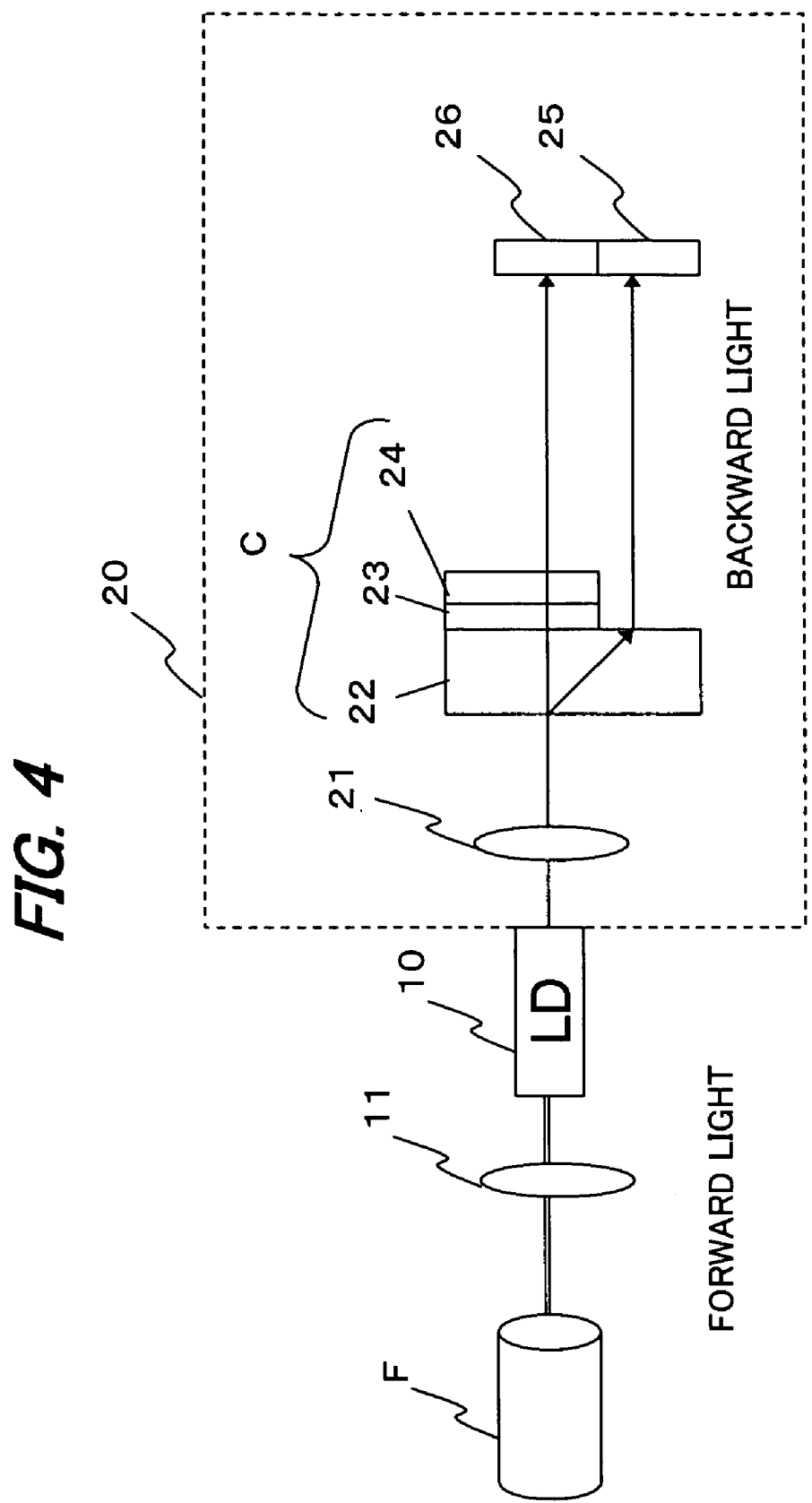
FIG. 4 is an explanatory diagram of Modification 1 of the wavelength locker according to the first embodiment, and shows an example in which a birefringent plate, a λ/4 plate, and the etalon filter are integrated.

In addition, according to the wavelength locker 20, the birefringent plate 22, the λ/4 plate 23, and the etalon filter 24 can be made of parallel plates and disposed. Therefore, as shown in FIG. 4, the birefringent plate 22, the λ/4 plate 23, and the etalon filter 24 can be integrated into a component (component C of FIG. 4). Accordingly, the wavelength locker 20 can be made further compact.

Figure 5:
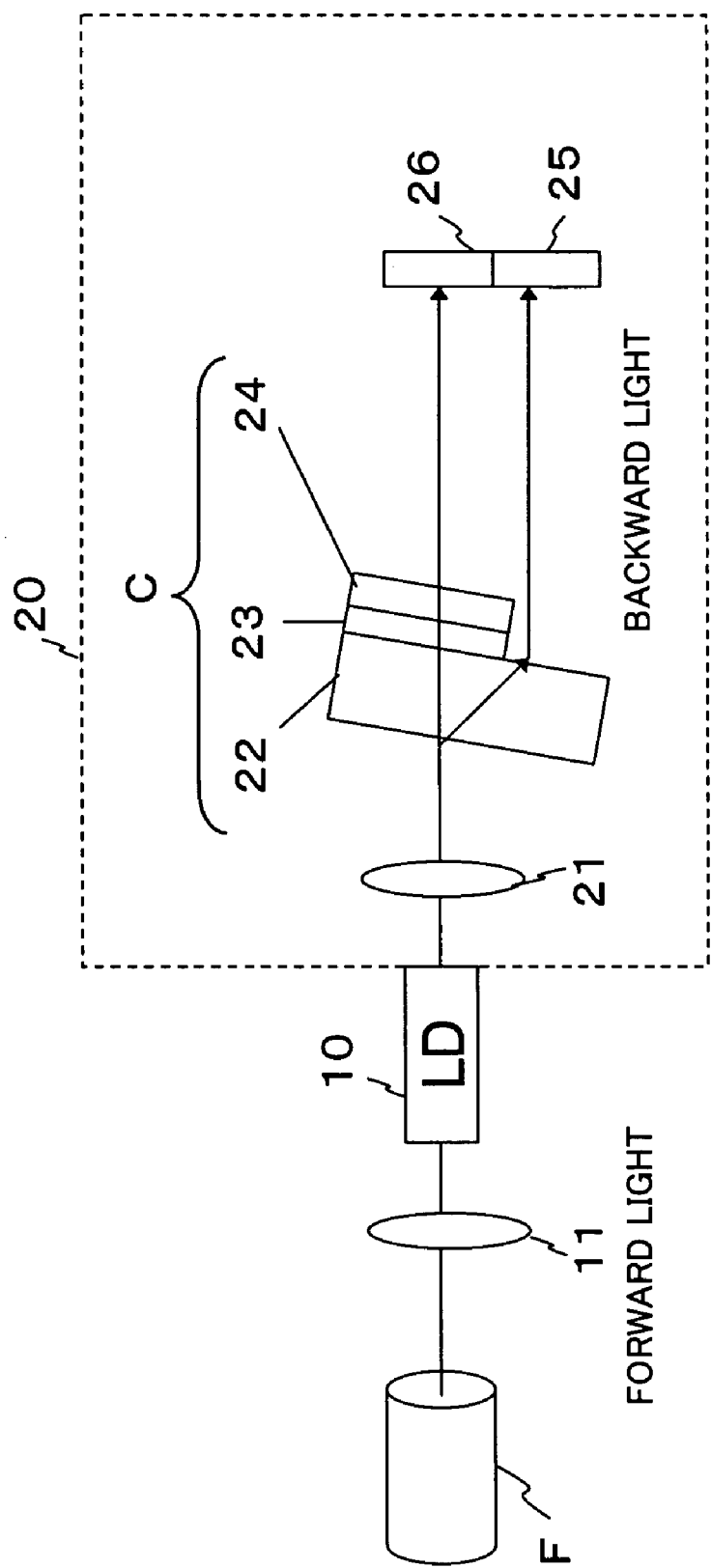
FIG. 5 is an explanatory diagram of Modification 2 of the wavelength locker according to the first embodiment, and shows an example in which the integrated component shown in FIG. 4 is tilted.

Further, as shown in FIG. 5, the component (component C) obtained by integrating the birefringent plate 22, the λ/4 plate 23, and the etalon filter 24, can be tilted with respect to the optical axis of the backward light emitted from the LD 10. With this arrangement, it is possible to prevent light reflected by the birefringent plate 22 from returning to the LD 10, thus enhancing the wavelength-lock precision.

Second Embodiment

Next, a second embodiment of the present invention is described. The second embodiment is similar to the first embodiment (FIG. 1) in structure. Differences therebetween are mainly described, and descriptions of similarities therebetween are omitted.

<Structure>

Figure 6:
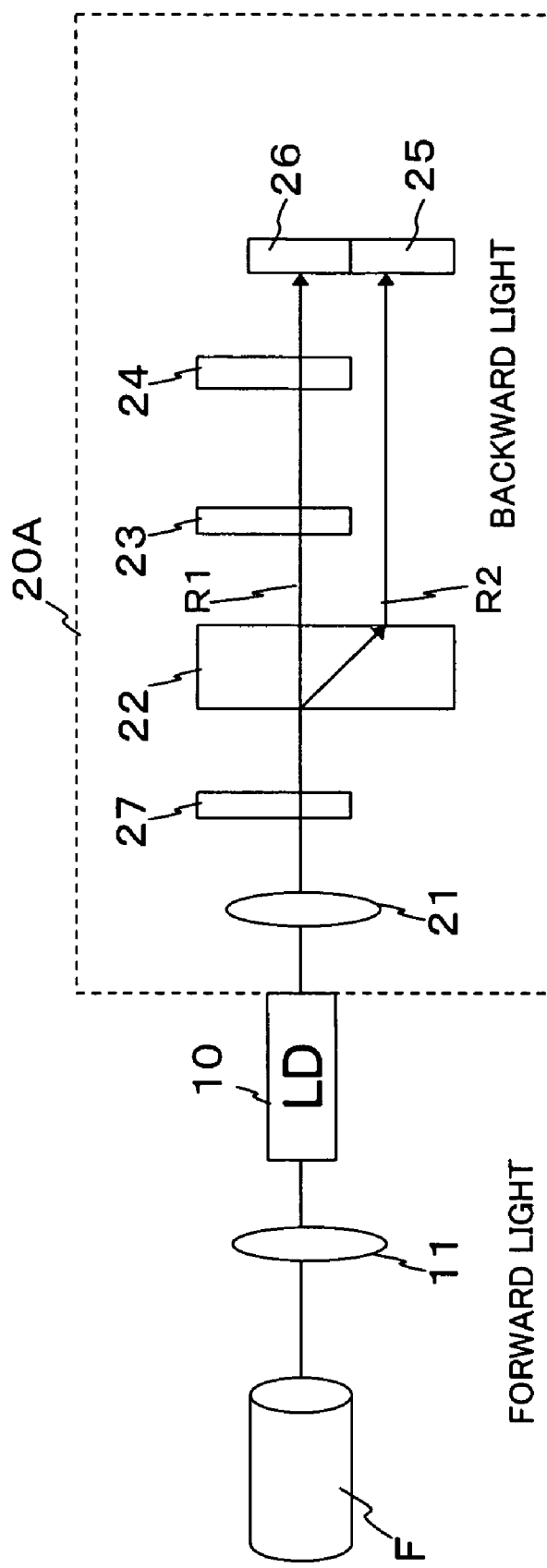
FIG. 6 is a diagram showing an example structure of a wavelength locker according to a second embodiment of the present invention.

FIG. 6 is a diagram showing an example structure of a wavelength locker according to a second embodiment, and shows an LD module including a wavelength locker 20A of the second embodiment. The wavelength locker 20A is different from the wavelength locker 20 (FIG. 1) of the first embodiment in that the λ/4 plate 23 serves as a first λ/4 plate, and a second λ/4 plate 27 serving as a second polarizing element is inserted between the lens 21 and the birefringent plate 22.

The optic axis of the λ/4 plate 27 is tilted at 45 degrees with respect to the polarization direction of light (inputted light) incident on the λ/4 plate 27. Unlike the first embodiment, the optic axis of the birefringent plate 22 is set at a desired angle. The optic axis of the λ/4 plate 23 is tilted at 45 degrees with respect to the polarization direction of light (inputted light) incident on the λ/4 plate 23.

<Operation>

According to the wavelength locker 20A, the backward light emitted from the LD 10 is collimated by the lens 21 and is incident on the birefringent plate 22 after passing through the λ/4 plate 27. Due to the birefringence of the birefringent plate 22, the inputted light is separated into two beams of light, i.e., the ordinary light R1 and the extraordinary light R2, which have different polarization states. The ordinary light R1 travels straight, and the extraordinary light R2 travels after being refracted.

One (in FIG. 6, the extraordinary light R2) of the two beams is directly received by the PD 25. The other one (in FIG. 6, the ordinary light R1) is received by the PD 26 after passing through the λ/4 plate 23 and the etalon filter 24.

Figure 7:
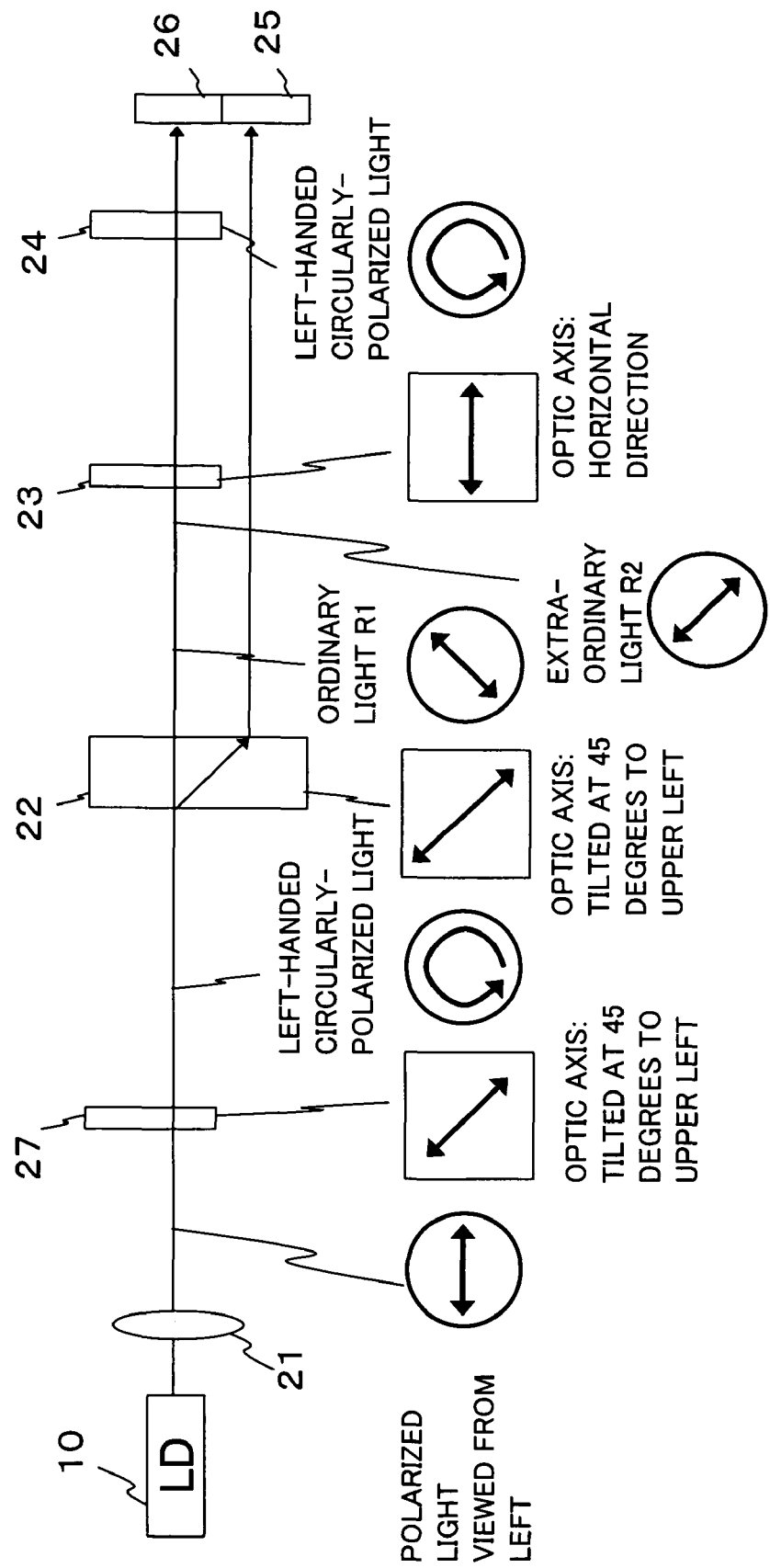
FIG. 7 is a diagram for explaining a polarization direction of backward light emitted from an LD, in the wavelength locker shown in FIG. 6.
Figure 8:
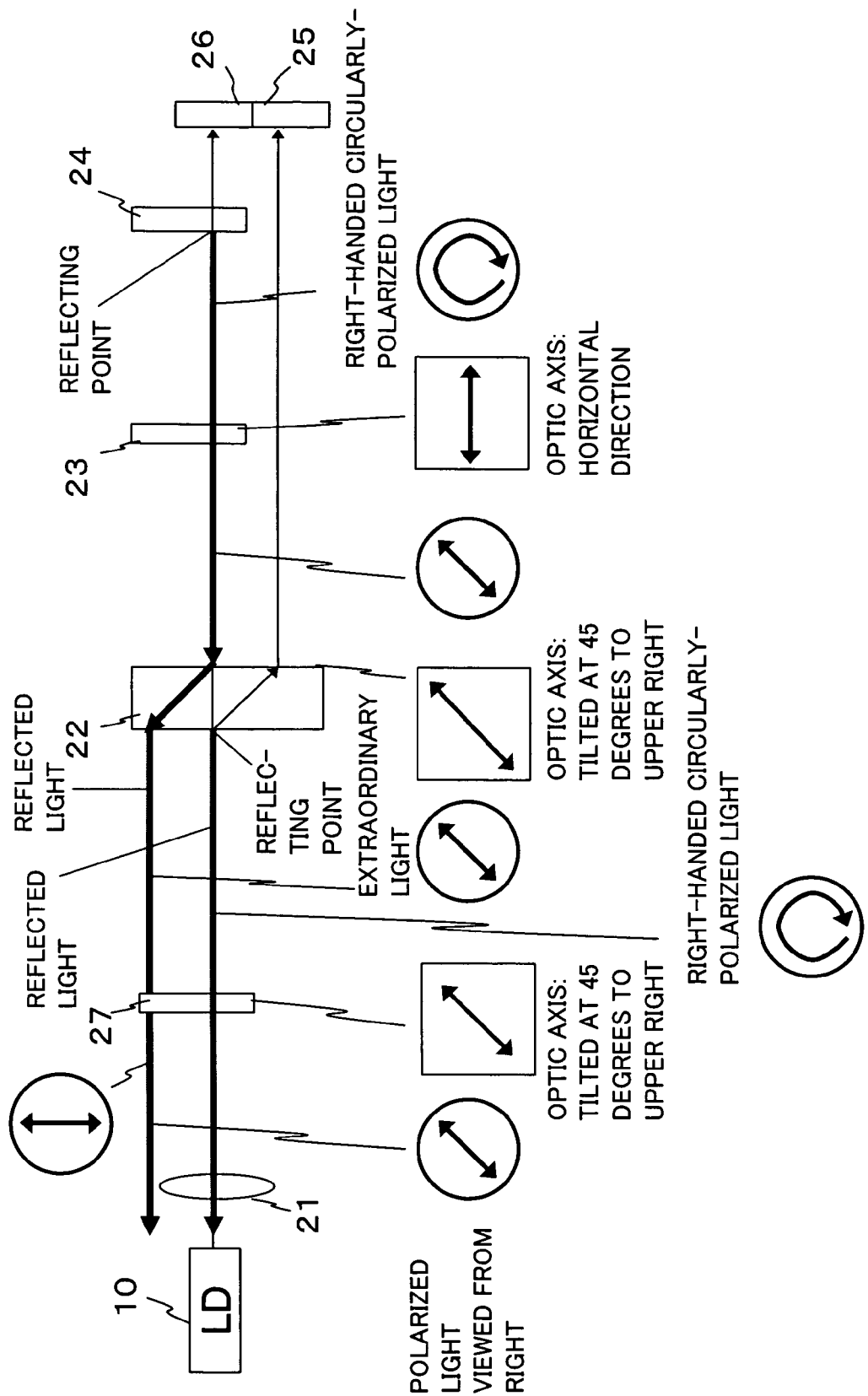
FIG. 8 is a diagram for explaining a polarization direction of each beam of light reflected by an etalon filter and a birefringent plate in the wavelength locker shown in FIG. 6.

FIG. 7 is a diagram showing a polarization state of the backward light in the wavelength locker 20A shown in FIG. 6. FIG. 8 is a diagram showing a polarization state of light reflected by the end surface of the etalon filter 24.

As shown in FIG. 7, the backward light outputted from the LD 10 is TE-polarized (horizontally polarized) light, and is incident on the λ/4 plate 27. The optic axis of the λ/4 plate 27 is tilted at 45 degrees with respect to the polarization direction of the inputted light (at 45 degrees to the upper left viewed from the left side of FIG. 7). Accordingly, the backward light emitted from the λ/4 plate 27 travels straight as left-handed circularly-polarized light and is incident on the birefringent plate 22.

The optic axis of the birefringent plate 22 is tilted at 45 degrees with respect to the polarization direction of the inputted light. The optic axis is tilted at 45 degrees to the upper left viewed from the left side of FIG. 7. Accordingly, light inputted to the birefringent plate 22 is separated into the ordinary light R1 and the extraordinary light R2 whose polarization directions are perpendicular to each other, and the ordinary light R1 and the extraordinary light R2 are emitted.

The ordinary light R1 is incident on the λ/4 plate 23. The optic axis of the λ/4 plate 23 is tilted at 45 degrees with respect to the polarization direction of the inputted light (in FIG. 7, in a horizontal direction). Accordingly, the ordinary light R1 is emitted from the λ/4 plate 23 as left-handed circularly-polarized light viewed from the left side of the figure. As shown in FIG. 8, when reflected by the end surface of the etalon filter 24, the left-handed circularly-polarized light becomes right-handed circularly-polarized light viewed from the right side of the figure, and the right-handed circularly-polarized light travels back through the optical path of the ordinary light R1 and is incident on the λ/4 plate 23. The reflected light becomes linearly-polarized light tilted at 45 degrees to the upper right viewed from the right side of the figure when passing through the λ/4 plate 23 and is incident on the birefringent plate 22.

The reflected light (inputted light) incident on the birefringent plate 22 operates as extraordinary light because the polarization direction thereof matches the optic axis of the birefringent plate 22 and is refracted in the birefringent plate 22. Accordingly, the reflected light is emitted from a position which is shifted from the point where the backward light is incident on the birefringent plate 22 by a predetermined distance, and is not incident on the LD 10. As described above, since the reflected light is prevented from returning to the LD 10, an adverse effect on the wavelength-lock precision of the wavelength locker 20 can be suppressed.

As shown in FIG. 8, when the backward light is incident on the end surface of the birefringent plate 22, reflected light of the backward light is generated. The reflected light becomes right-handed circularly-polarized light viewed from the right side of the figure to enter the λ/4 plate 27, and is outputted as TM-polarized (vertically polarized) light. The reflected light travels back through the optical path of the backward light emitted from the LD 10 to return to the LD 10. However, since the reflected light is TM-polarized light which is perpendicular to the backward light (TE-polarized light) emitted from the LD 10, an influence caused by the return of the reflected light to the LD 10 can be suppressed. Specifically, the influence on the LD 10 can be reduced to about 1/1000 compared with a case where TE-polarized reflected light returns to the LD 10.

<Effect>

According to the LD module (wavelength locker 20A) of the second embodiment, the wavelength locker 20A becomes larger in size since the λ/4 plate 27 is added to the wavelength locker 20 (FIG. 1). However, as in the wavelength locker 20, the wavelength locker can be made much more compact than the prior art (FIG. 24). Further, in the second embodiment, an influence of the backward light caused by the birefringent plate 22 can be reduced as compared with that in the first embodiment.

<Modifications>

The second embodiment can be modified as in the first embodiment. Specifically, instead of the structure of FIG. 6, a structure may be used in which the λ/4 plate 23 and the etalon filter 24 shown in FIG. 6 are inserted in the optical path of the extraordinary light R2, which is separated by the birefringent plate 22.

Figure 9:
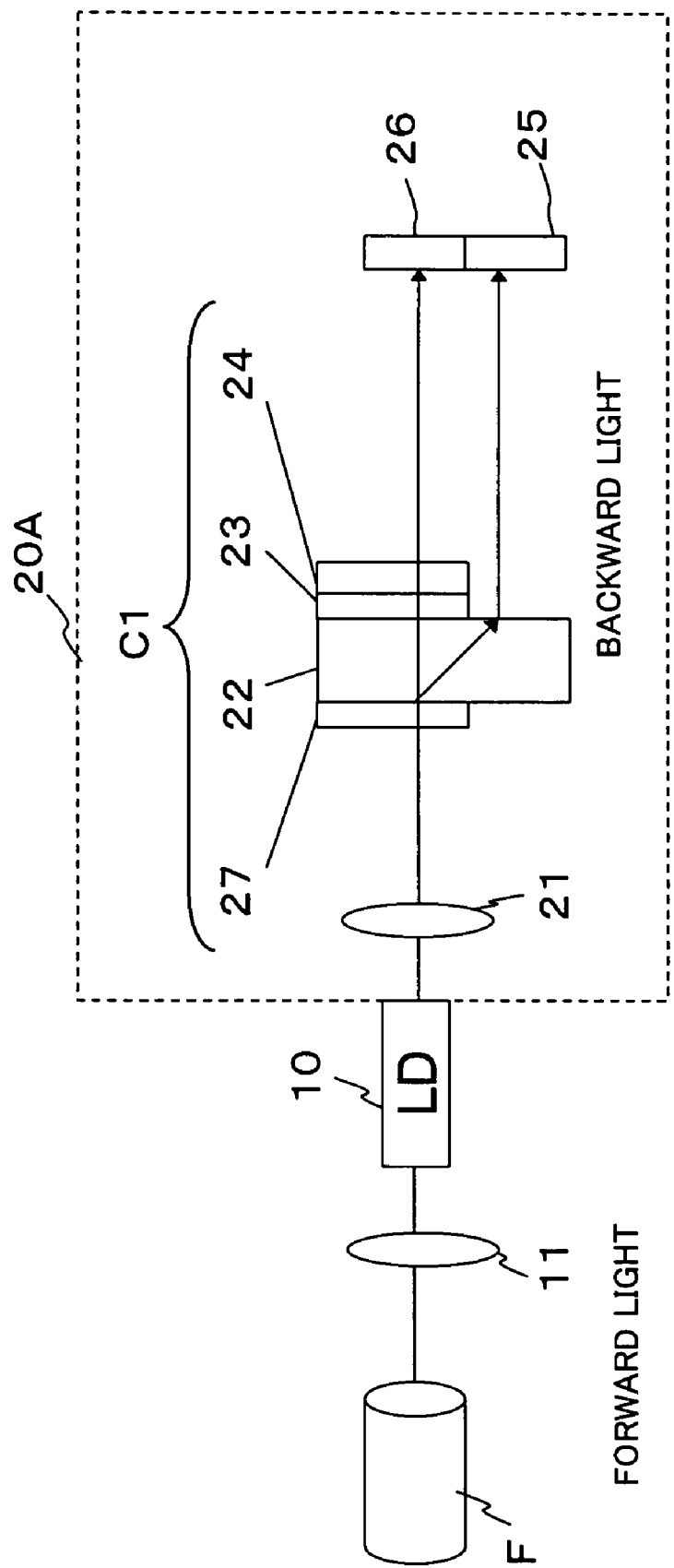
FIG. 9 is an explanatory diagram of Modification 1 of the wavelength locker according to the second embodiment, and shows an example in which a second λ/4 plate, the birefringent plate, a first λ/4 plate, and the etalon filter are integrated.

In addition, the λ/4 plate 27 can also be formed in a parallel plate shape, so the λ/4 plate 27, the birefringent plate 22, the λ/4 plate 23, and the etalon filter 24 can be integrated into a component (component C1 of FIG. 9), as shown in FIG. 9. With this structure, the wavelength locker 20A can be made further compact.

Figure 10:
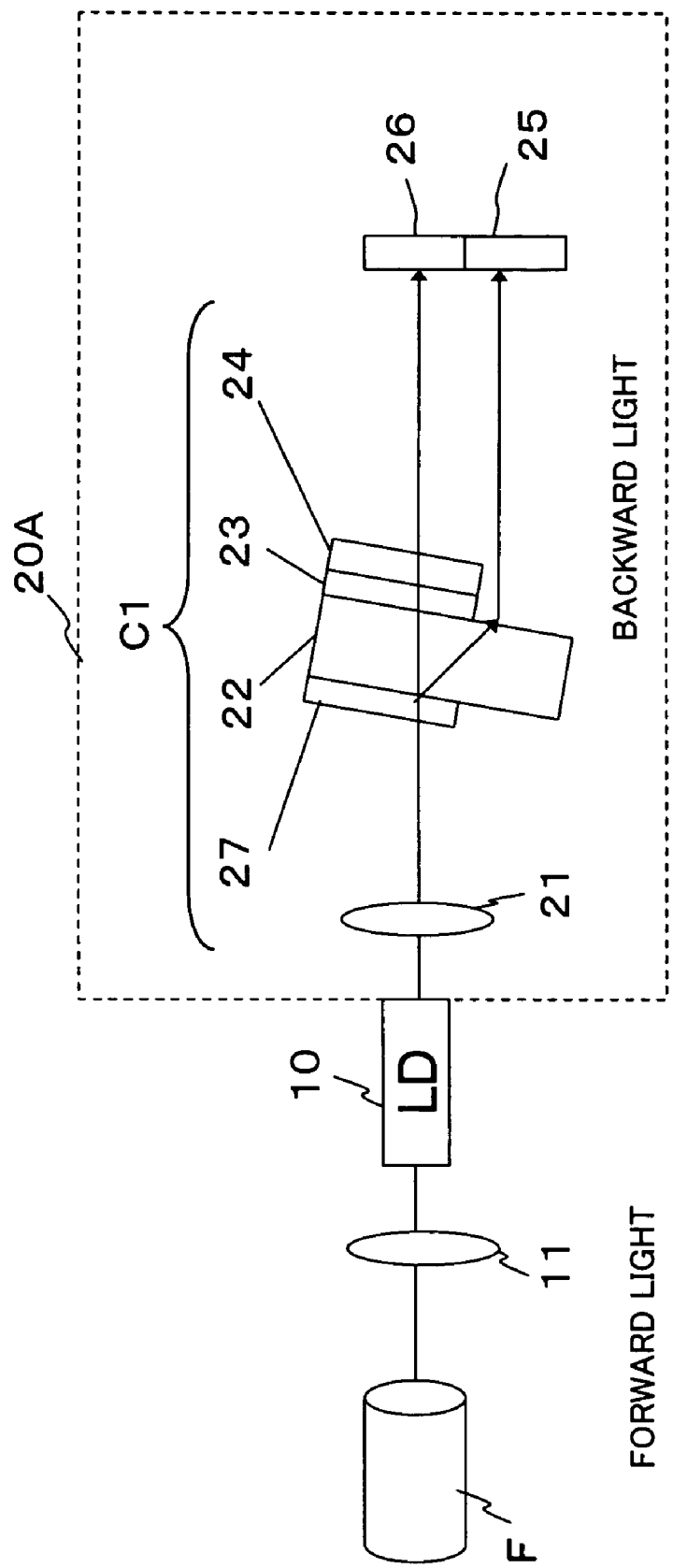
FIG. 10 is an explanatory diagram of Modification 2 of the wavelength locker according to the second embodiment, and shows an example in which the integrated component shown in FIG. 9 is tilted.

Further, as shown in FIG. 10, it is possible to prevent the reflected light from returning to the LD 10 by tilting the component C1 shown in FIG. 9 with respect to the optical axis of the backward light.

Figure 11:
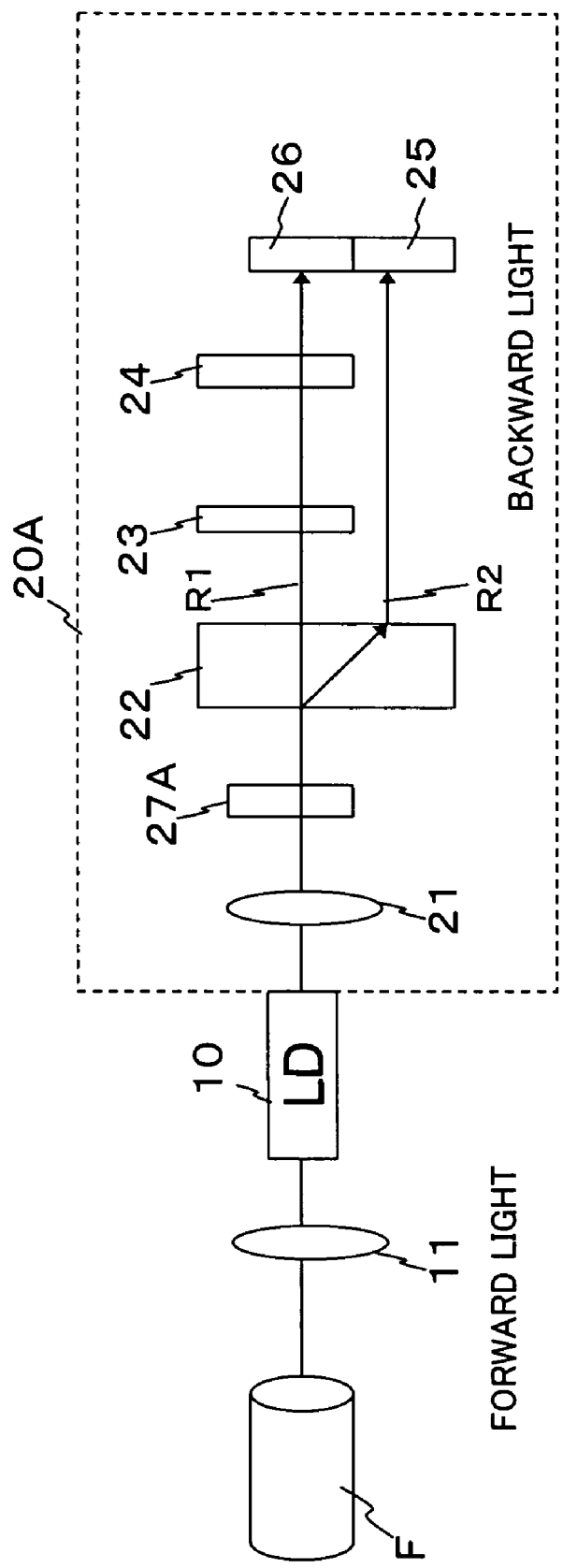
FIG. 11 is an explanatory diagram of Modification 3 of the wavelength locker according to the second embodiment, and shows an example in which the second λ/4 plate is made smaller in size such that reflected light does not pass through the second λ/4 plate.
Figure 12:
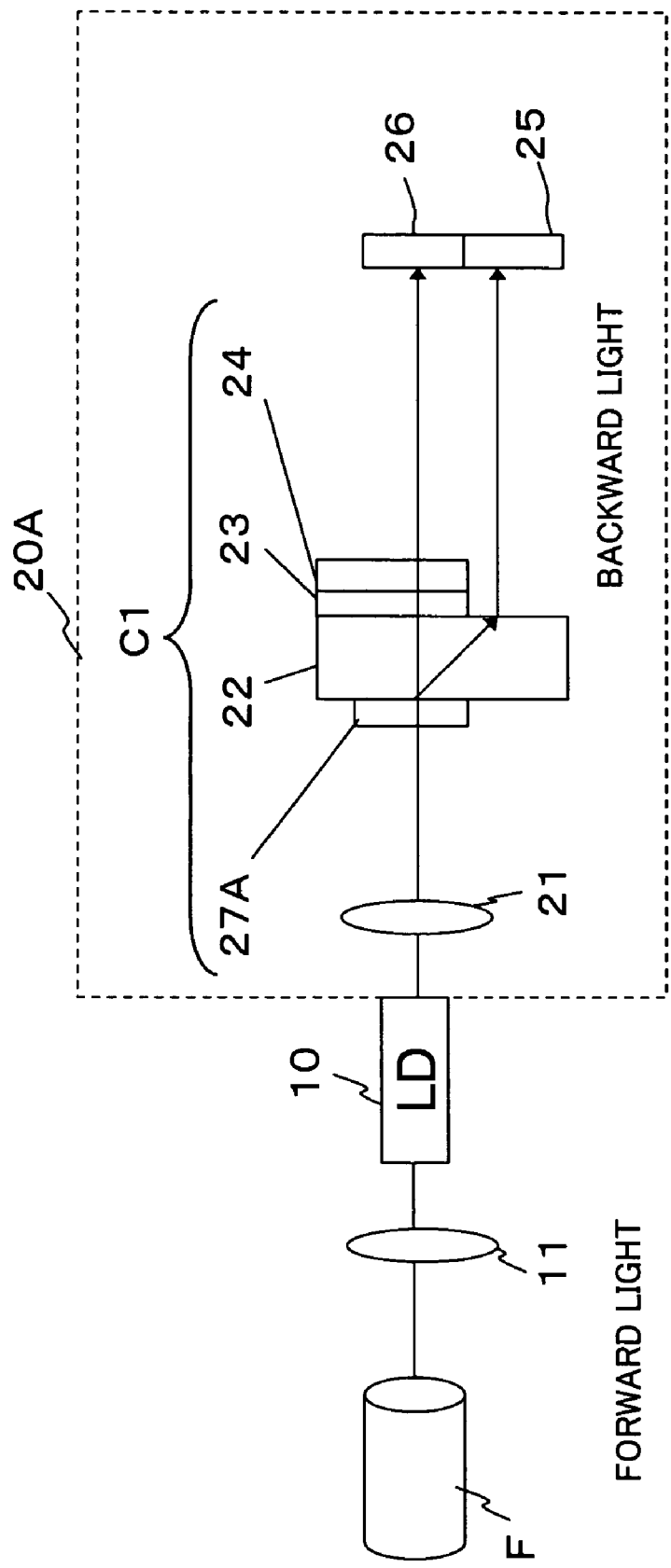
FIG. 12 is an explanatory diagram of Modification 4 of the wavelength locker according to the second embodiment, and shows an example in which the second λ/4 plate, which is made smaller in size, is applied to Modification 1 of FIG. 9.
Figure 13:
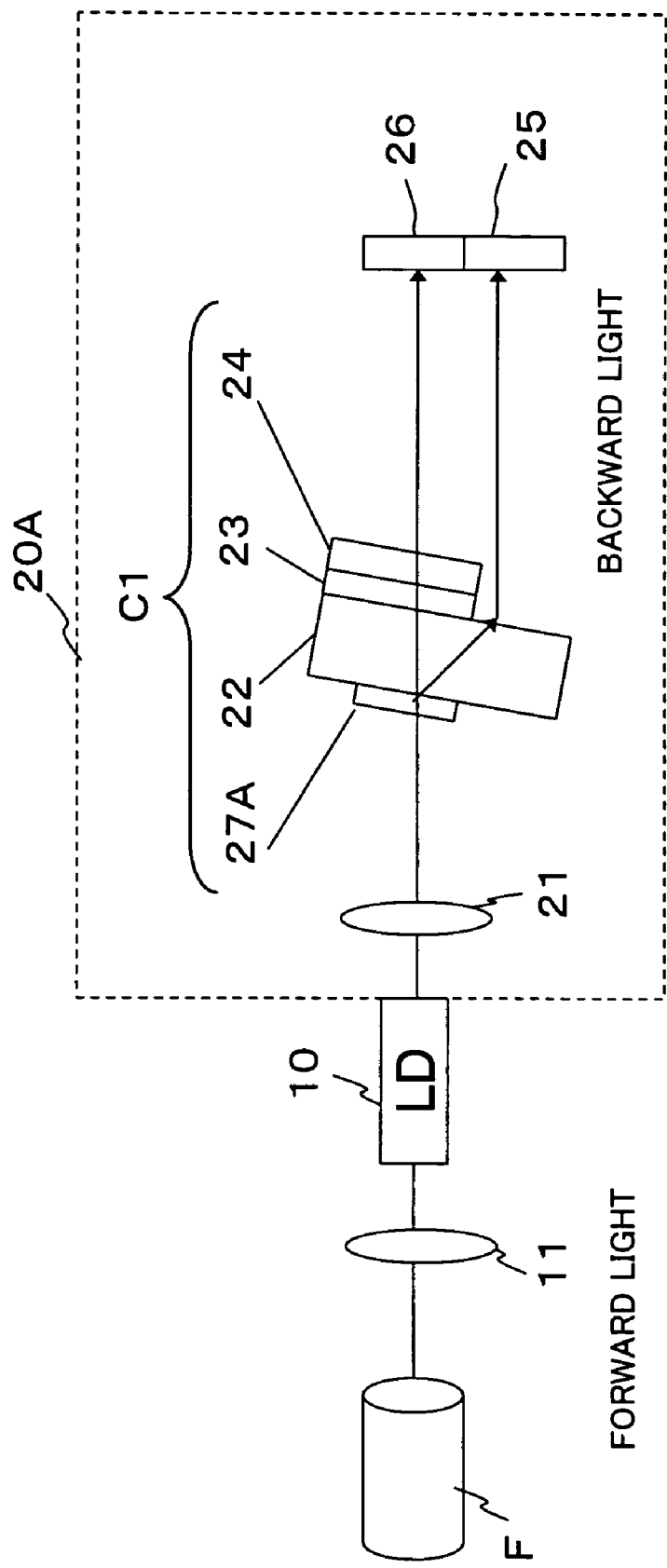
FIG. 13 is an explanatory diagram of Modification 5 of the wavelength locker according to the second embodiment, and shows an example in which the second λ/4 plate, which is made smaller in size, is applied to Modification 2 of FIG. 10.

Further, as shown in FIG. 11, it is possible to have a structure in which a λ/4 plate 27A whose size is smaller than the λ/4 plate 27 is used instead of the λ/4 plate 27 so that reflected light of the etalon filter 24 emitted from the birefringent plate 22 does not pass through the λ/4 plate 27A. It is also possible to use the component C1 to which the λ/4 plate 27A is applied (see FIGS. 12 and 13).

Third Embodiment

Next, a third embodiment of the present invention is described. The third embodiment is similar to the first embodiment (FIG. 1) in structure. Differences therebetween are mainly described, and descriptions of similarities therebetween are omitted.

<Structure>

Figure 14:
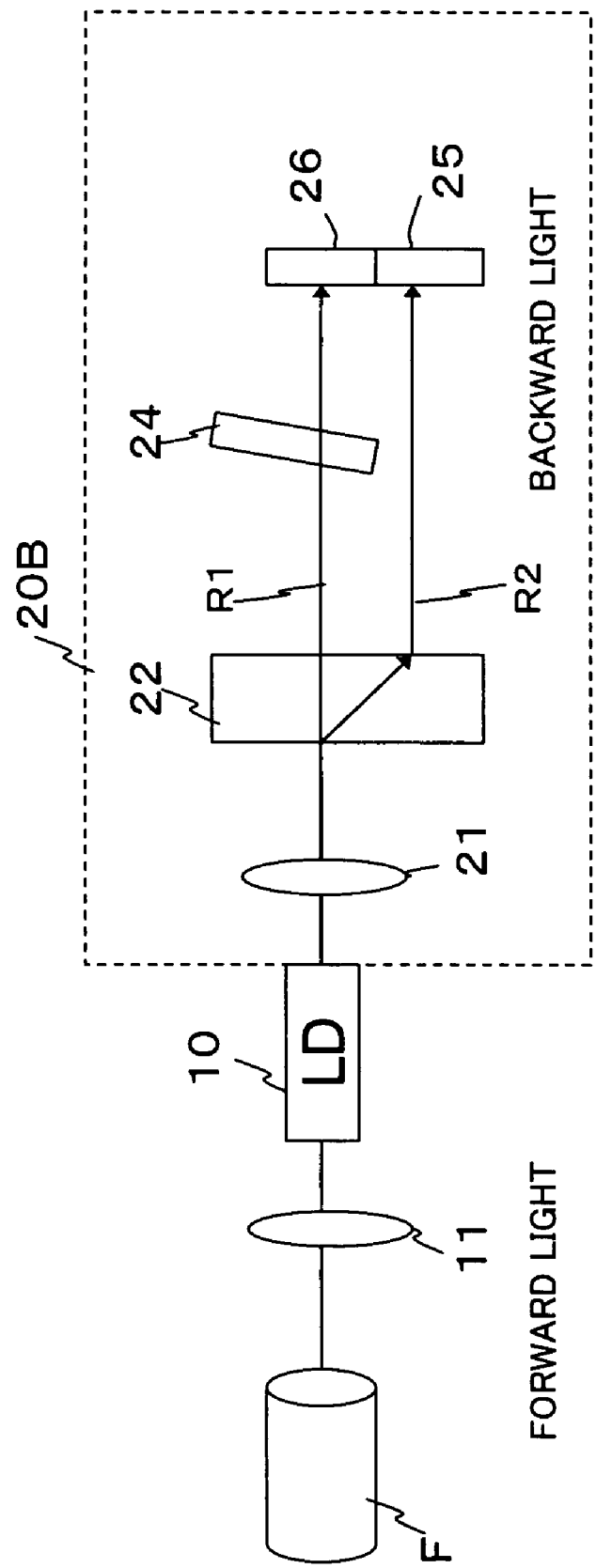
FIG. 14 is a diagram showing an example structure of a wavelength locker according to a third embodiment of the present invention.

FIG. 14 is a diagram showing an example structure of a wavelength locker according to a third embodiment, and shows an LD module including a wavelength locker 20B of the third embodiment. The wavelength locker 20B is different from the wavelength locker 20 (FIG. 1) of the first embodiment in that the λ/4 plate 23 is omitted and the etalon filter 24 is tilted with respect to the optical axis of the backward light emitted from the birefringent plate 22. The optic axis of the birefringent plate 22 is tilted at 45 degrees with respect to the polarization direction of inputted light incident on the birefringent plate 22, as in the first embodiment.

<Operation>

According to the wavelength locker 20B, the backward light emitted from the LD 10 is collimated by the lens 21 and is incident on the birefringent plate 22 as parallel light. Due to the birefringence of the birefringent plate 22, the inputted light is separated into the ordinary light R1 and the extraordinary light R2. The ordinary light R1 travels straight, and the extraordinary light R2 travels after being refracted. One (in FIG. 14, the extraordinary light R2) of the two beams of the light is directly received by the PD 25. The other one (in FIG. 14, the ordinary light R1) of the two beams of the light is received by the PD 26 after passing through the etalon filter 24.

<Effect>

According to the wavelength locker 20B, the same miniaturization effect as in the first embodiment (FIG. 1) can be achieved although it is necessary to tilt the etalon filter 24. Since the etalon filter 24 is tilted with respect to the optical axis of inputted light, light reflected by the etalon filter 24 is prevented from returning to the LD 10.

<Modification>

The wavelength locker 20B of the third embodiment can be modified in the following way. For example, the etalon filter 24 may be inserted in the path of either of the ordinary light R1 and the extraordinary light R2, which are separated by the birefringent plate 22. Instead of the structure of FIG. 14, the etalon filter 24 may be inserted in the optical path of the extraordinary light R2.

Figure 15:
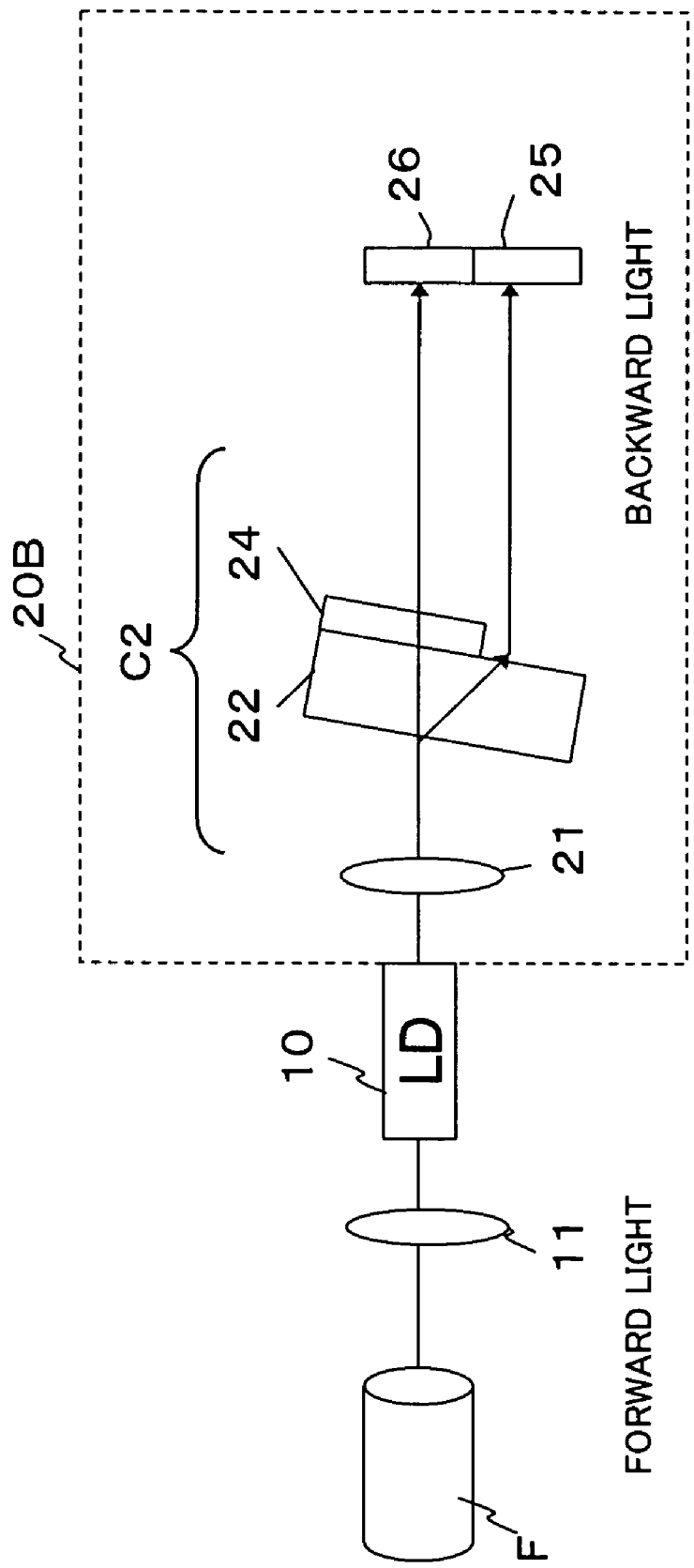
FIG. 15 is an explanatory diagram of a modification of the wavelength locker according to the third embodiment, and shows an example in which a birefringent plate and an etalon filter which are shown in FIG. 14 are integrated and tilted.

Further, as shown in FIG. 15, in the wavelength locker 20B, it may be possible to form each of the birefringent plate 22 and the etalon filter 24 in a parallel plate shape, integrate the birefringent plate 22 and the etalon filter 24 into a component (component C2 of FIG. 15), and tilt the component C2 with respect to the optical axis of inputted light (backward light). In this case, light reflected by the etalon filter 24 can be prevented from returning to the LD 10.

Fourth Embodiment

Next, a fourth embodiment of the present invention is described. The fourth embodiment is similar to the wavelength locker 20A (FIG. 6) of the second embodiment in structure. Differences therebetween are mainly described, and descriptions of similarities therebetween are omitted.

<Structure>

Figure 16:
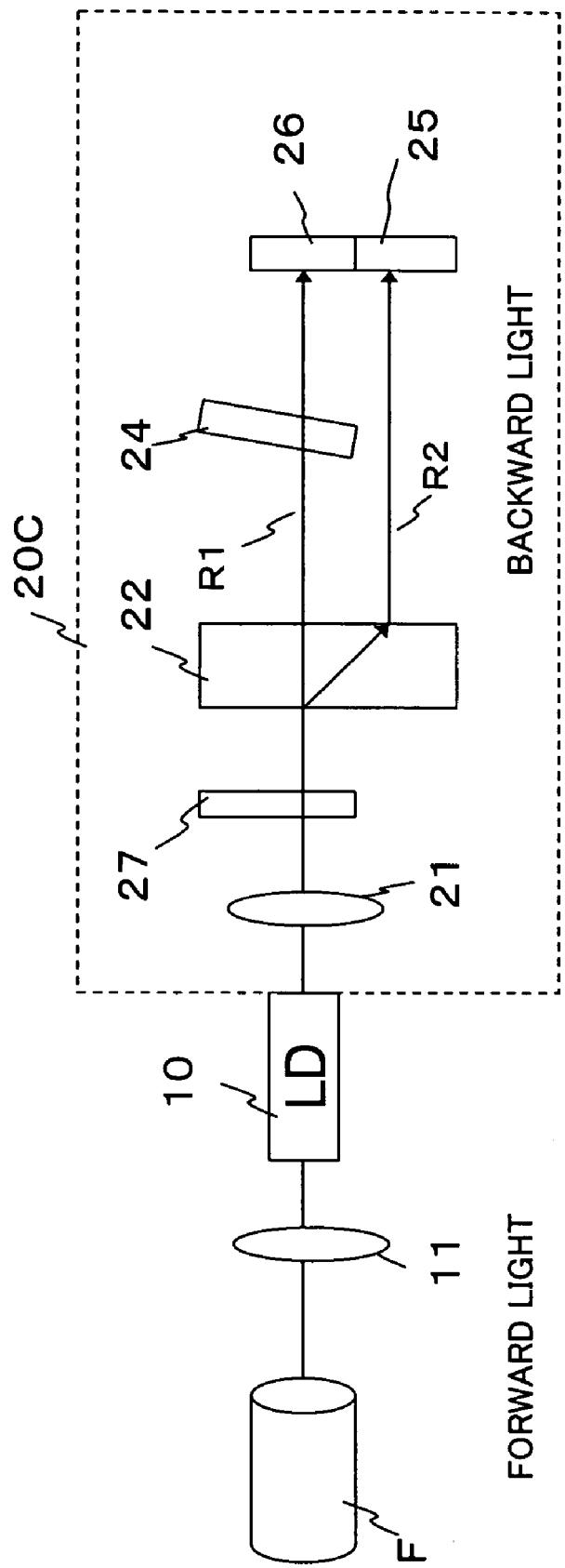
FIG. 16 is a diagram showing an example structure of a wavelength locker according to a fourth embodiment of the present invention.

FIG. 16 is a diagram showing an example structure of a wavelength locker according to the fourth embodiment, and shows an LD module including a wavelength locker 20C of the fourth embodiment. The wavelength locker 20C is different from the wavelength locker 20A (FIG. 6) of the second embodiment in that the λ/4 plate 23 is omitted. The etalon filter 24 is tilted with respect to the optical axis of inputted light.

In the fourth embodiment, the optic axis of the λ/4 plate 27 is tilted at 45 degrees with respect to the polarization direction of light (inputted light) incident on the λ/4 plate 27. On the other hand, the optic axis of the birefringent plate 22 can be set at a desired angle.

<Operation>

According to the wavelength locker 20C, the backward light emitted from the LD 10 is collimated by the lens 21 and is incident on the birefringent plate 22 after passing through the λ/4 plate 27. Due to the birefringence of the birefringent plate 22, the inputted light is separated into two beams of light, i.e., the ordinary light R1 and the extraordinary light R2, which have different polarization states. The ordinary light R1 travels straight, and the extraordinary light R2 travels after being refracted. One (in FIG. 16, the extraordinary light R2) of the two beams is directly received by the PD 25. The other one (in FIG. 16, the ordinary light R1) is received by the PD 26 after passing through the etalon filter 24.

<Effect>

According to the wavelength locker 20C of the fourth embodiment, the same effect as in the third embodiment can be obtained. Further, according to the wavelength locker 20C, the λ/4 plate 27 operates similarly to the λ/4 plate 27 of the second embodiment to change the polarization direction of light (reflected light) reflected by the end surface of the birefringent plate 22 to a direction perpendicular to the polarization direction of the backward light. Therefore, an influence caused by the return of the reflected light to the LD 10 can be reduced.

<Modification>

The wavelength locker 20C of the fourth embodiment can be modified in the following way. For example, the etalon filter 24 may be inserted in the path of either of the ordinary light R1 and the extraordinary light R2, which are separated by the birefringent plate 22. Instead of the structure of FIG. 16, the etalon filter 24 may be inserted in the optical path of the extraordinary light R2.

Figure 17:
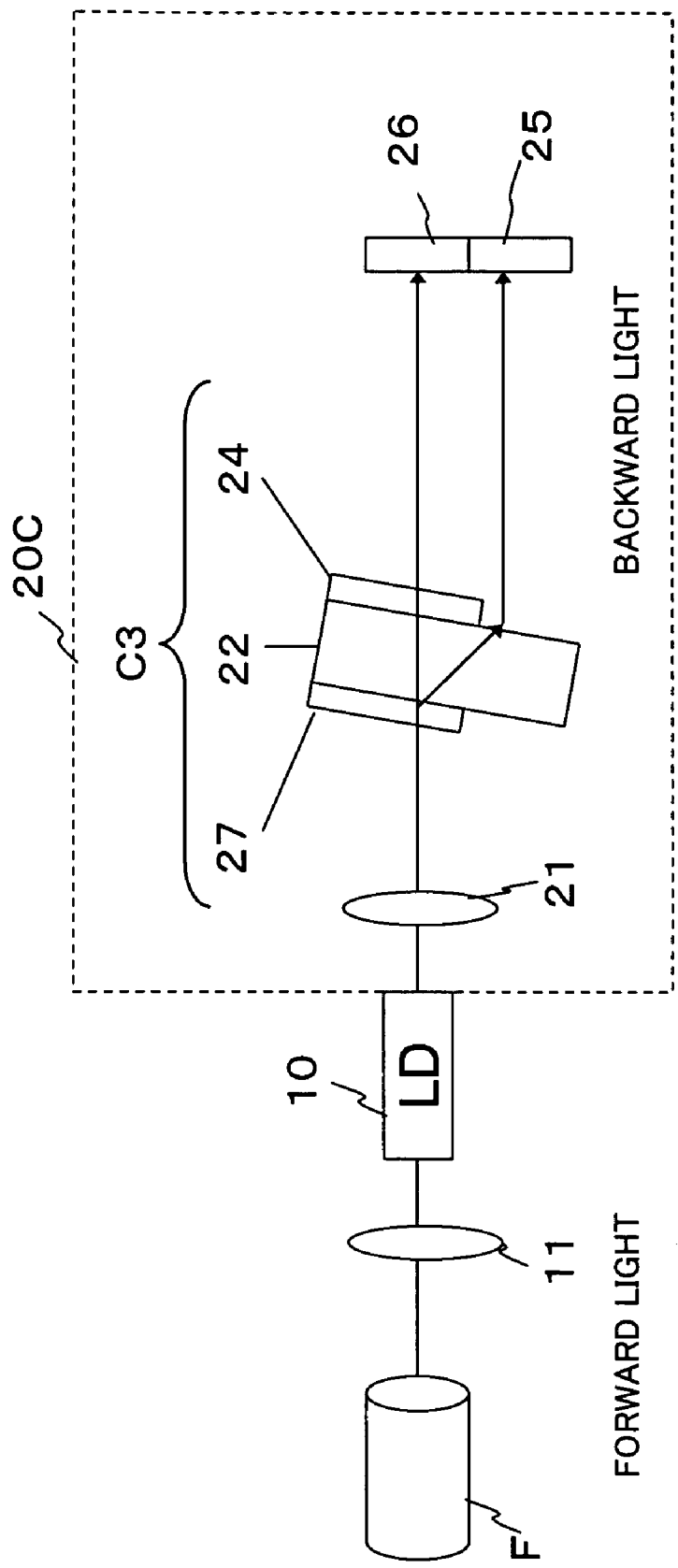
FIG. 17 is a diagram showing a modification of the wavelength locker according to the fourth embodiment, and shows an example in which a λ/4 plate, a birefringent plate, and an etalon filter which are shown in FIG. 16 are integrated and tilted.

Further, as shown in FIG. 17, in the wavelength locker 20C, it may be possible to form each of the λ/4 plate 27, the birefringent plate 22, and the etalon filter 24 in a parallel plate shape, integrate the λ/4 plate 27, the birefringent plate 22, and the etalon filter 24 into a component (component C3 of FIG. 17), and tilt the component C3 with respect to the optical axis of inputted light (backward light). With this arrangement, the wavelength locker 20C can be made further compact.

Fifth Embodiment

Next, a fifth embodiment of the present invention is described. The fifth embodiment is similar to the wavelength locker 20 (FIG. 1) of the first embodiment in structure. Differences therebetween are mainly described, and descriptions of similarities therebetween are omitted.

<Structure>

Figure 18:
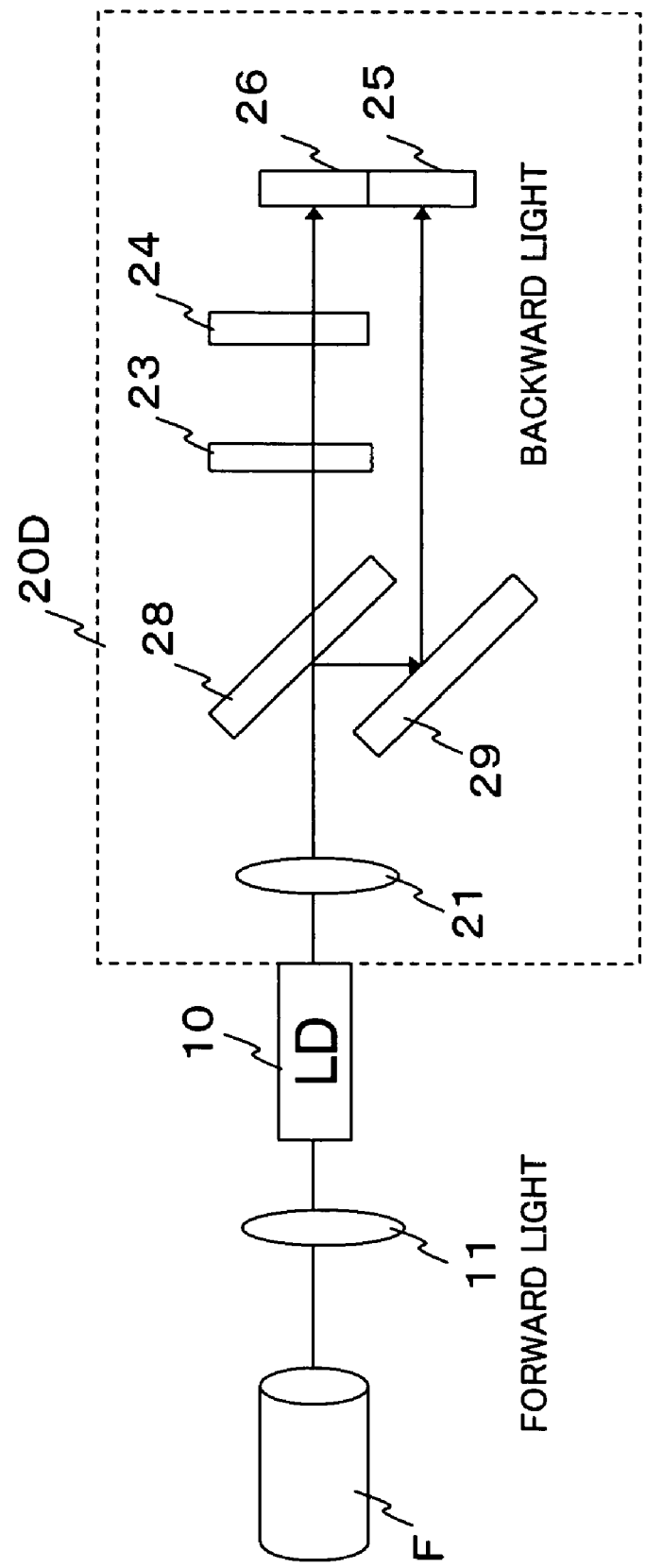
FIG. 18 is a diagram showing an example structure of a wavelength locker according to a fifth embodiment of the present invention.

FIG. 18 is a diagram showing an example structure of a wavelength locker according to the fifth embodiment, and shows an LD module including a wavelength locker 20D of the fifth embodiment. The wavelength locker 20D is different from the wavelength locker 20 (FIG. 1) of the first embodiment in that, instead of the birefringent plate 22, a half mirror 28 serving as a branching element and a total reflecting mirror 29 serving as a reflecting element are disposed in parallel between the lens 21 and the λ/4 plate 23.

The half mirror 28 is disposed on the optical path of the backward light emitted from the lens 21, with its surface on which the backward light is incident being tilted at 45 degrees toward the LD 10 with respect to the optical axis of the backward light. The half mirror 28 allows approximately half of the incident backward light to transmit and travel straight, and reflects the other half thereof. The light transmitted through the half mirror 28 travels straight and is received by the PD 26 after passing through the λ/4 plate 23 and the etalon filter 24.

The total reflecting mirror 29 is disposed on the optical path of the backward light reflected by the half mirror 28, and its reflecting surface is parallel to the incident surface (reflecting surface) of the half mirror 28. With this arrangement, the backward light reflected by the half mirror 28 is totally reflected by the total reflecting mirror 29 to travel straight as light that is parallel to the light transmitted through the half mirror 28, and is received by the PD 25. The optic axis of the λ/4 plate 23 is tilted at 45 degrees with respect to the polarization direction of light (inputted light) incident on the λ/4 plate 23.

<Operation>

According to the wavelength locker 20D, the backward light emitted from the LD 10 is collimated by the lens 21 and separated by the half mirror 28 into transmitted light and reflected light. The transmitted light is received by the PD 26 through the λ/4 plate 23 and the etalon filter 24, and the reflected light is received by the PD 25 after being reflected by the total reflecting mirror 29.

<Effects>

According to the wavelength locker 20D, the reflected light, which is separated by the half mirror 28, is caused by the total reflecting mirror 29 to be in parallel to the light transmitted through the half mirror 28, so the space optical system can be reduced compared with that of the prior art (FIG. 24). According to the wavelength locker 20D, as in the first embodiment, a PD array in which two PDs are integrated can be used as the PDs 25 and 26, so a mounting area can be reduced.

Further, light reflected by the end surface of the etalon filter 24 has a polarization direction perpendicular to that of the backward light emitted from the LD 10, after passing through the λ/4 plate 23. Therefore, an influence of the reflected light returning to the LD 10 is small.

<Modifications>

The wavelength locker 20D (FIG. 18) of the fifth embodiment can be modified in the following ways. For example, the λ/4 plate 23 and the etalon filter 24 may be inserted in the optical path of light reflected by the total reflecting mirror 29, instead of being inserted in the optical path of light transmitted through the half mirror 28.

Figure 19:
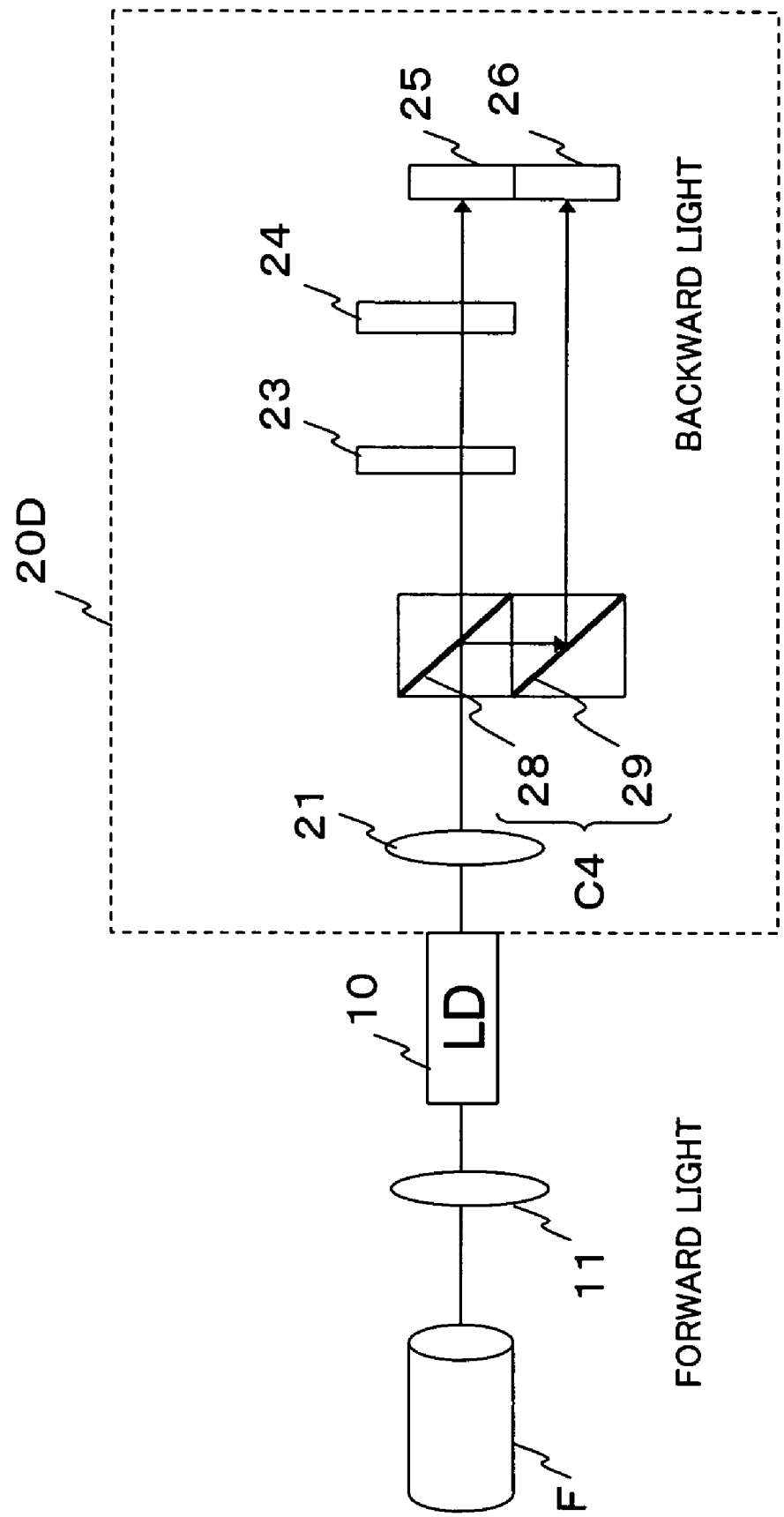
FIG. 19 is an explanatory diagram of Modification 1 of the wavelength locker according to the fifth embodiment, and shows an example in which a half mirror and a total reflecting mirror which are shown in FIG. 18 are integrated.
Figure 20:
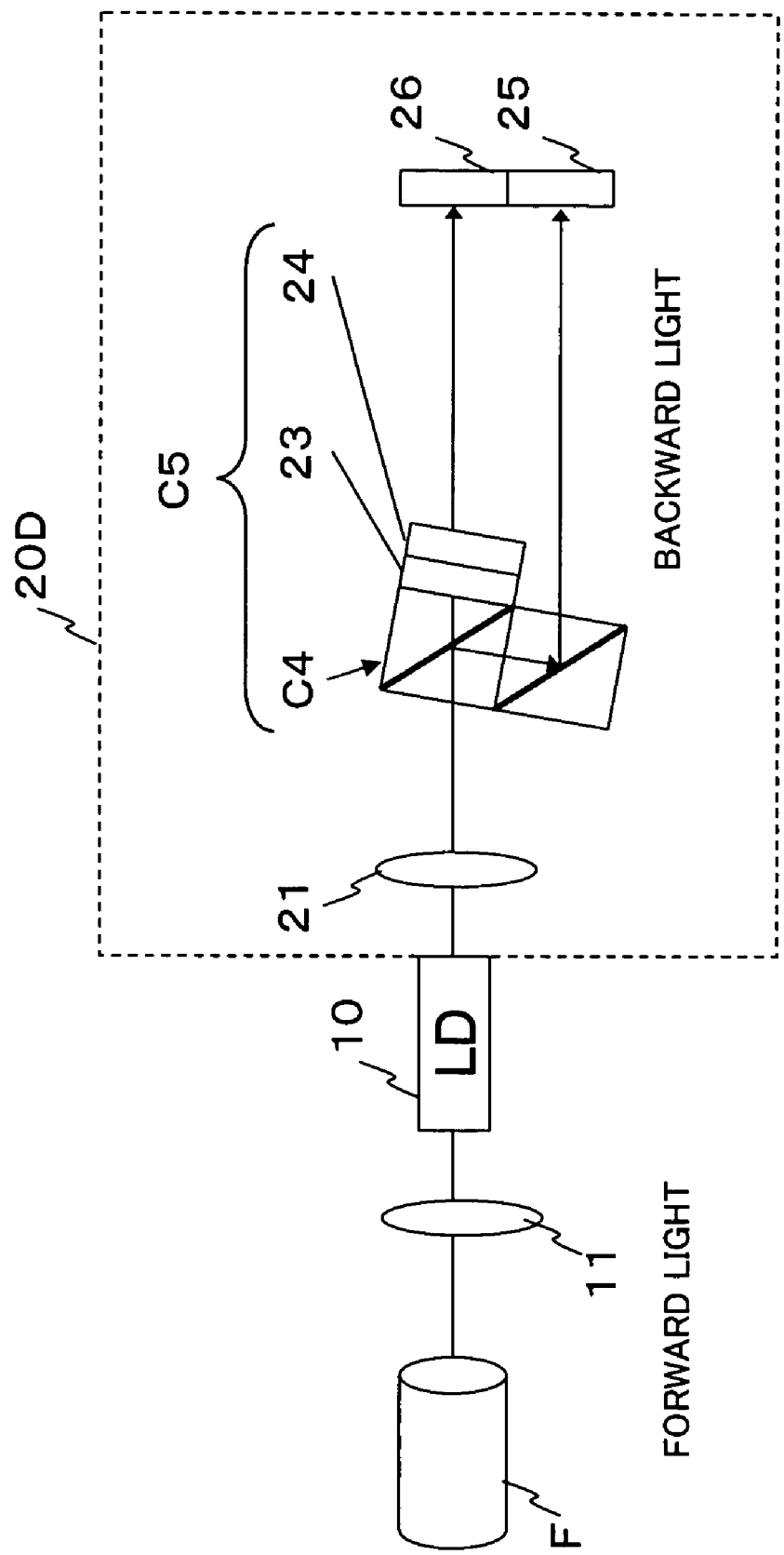
FIG. 20 is an explanatory diagram of Modification 2 of the wavelength locker according to the fifth embodiment, and shows an example in which the half mirror, the total reflecting mirror, a λ/4 plate, and an etalon filter which are shown in FIG. 18 are integrated and tilted.

In addition, as shown in FIG. 19, in the wavelength locker 20D, the half mirror 28 and the total reflecting mirror 29 may be integrated into a component (component C4 of FIG. 19). Further, as shown in FIG. 20, the component C4, the λ/4 plate 23, and the etalon filter 24 may be integrated into a component (component C5 of FIG. 20) and tilted with respect to the optical axis of the backward light emitted from the LD 10. With this arrangement, the wavelength locker 20D can be made further compact, and light reflected by the etalon filter 24 is prevented from returning to the LD 10.

Sixth Embodiment

Next, a sixth embodiment of the present invention is described. The sixth embodiment is similar to the wavelength locker 20D (FIG. 18) of the fifth embodiment in structure. Differences therebetween are mainly described, and descriptions of similarities therebetween are omitted.

<Structure>

Figure 21:
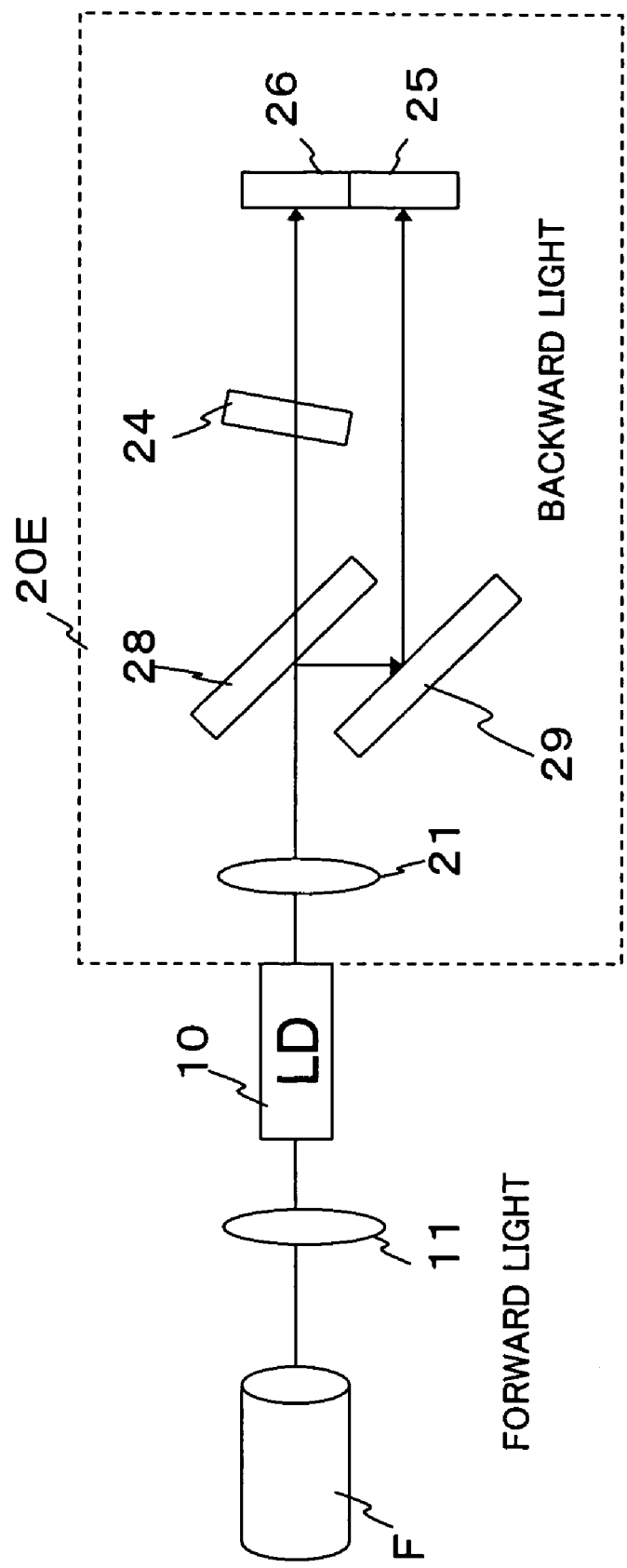
FIG. 21 is a diagram showing an example structure of a wavelength locker according to a sixth embodiment of the present invention.

FIG. 21 is a diagram showing an example structure of a wavelength locker according to the sixth embodiment, and shows an LD module including a wavelength locker 20E of the sixth embodiment. The wavelength locker 20E is different from the wavelength locker 20D (FIG. 18) of the fifth embodiment in that the λ/4 plate 23 disposed between the half mirror 28 and the etalon filter 24 is omitted and the etalon filter 24 is tilted with respect to the optical axis of inputted light.

<Operation>

According to the wavelength locker 20E, the backward light emitted from the LD 10 is collimated by the lens 21 and separated by the half mirror 28 into transmitted light and reflected light. The transmitted light is received by the PD 26 after passing through the etalon filter 24, and the reflected light is received by the PD 25 after being totally reflected by the total reflecting mirror 29.

<Effect>

According to the wavelength locker 20E, the same miniaturization effect as in the wavelength locker 20D of the fifth embodiment can be obtained although it is necessary to tilt the etalon filter 24 unlike in the wavelength locker 20D. Since the etalon filter 24 is tilted, its reflected light does not return to the LD 10.

<Modifications>

Figure 22:
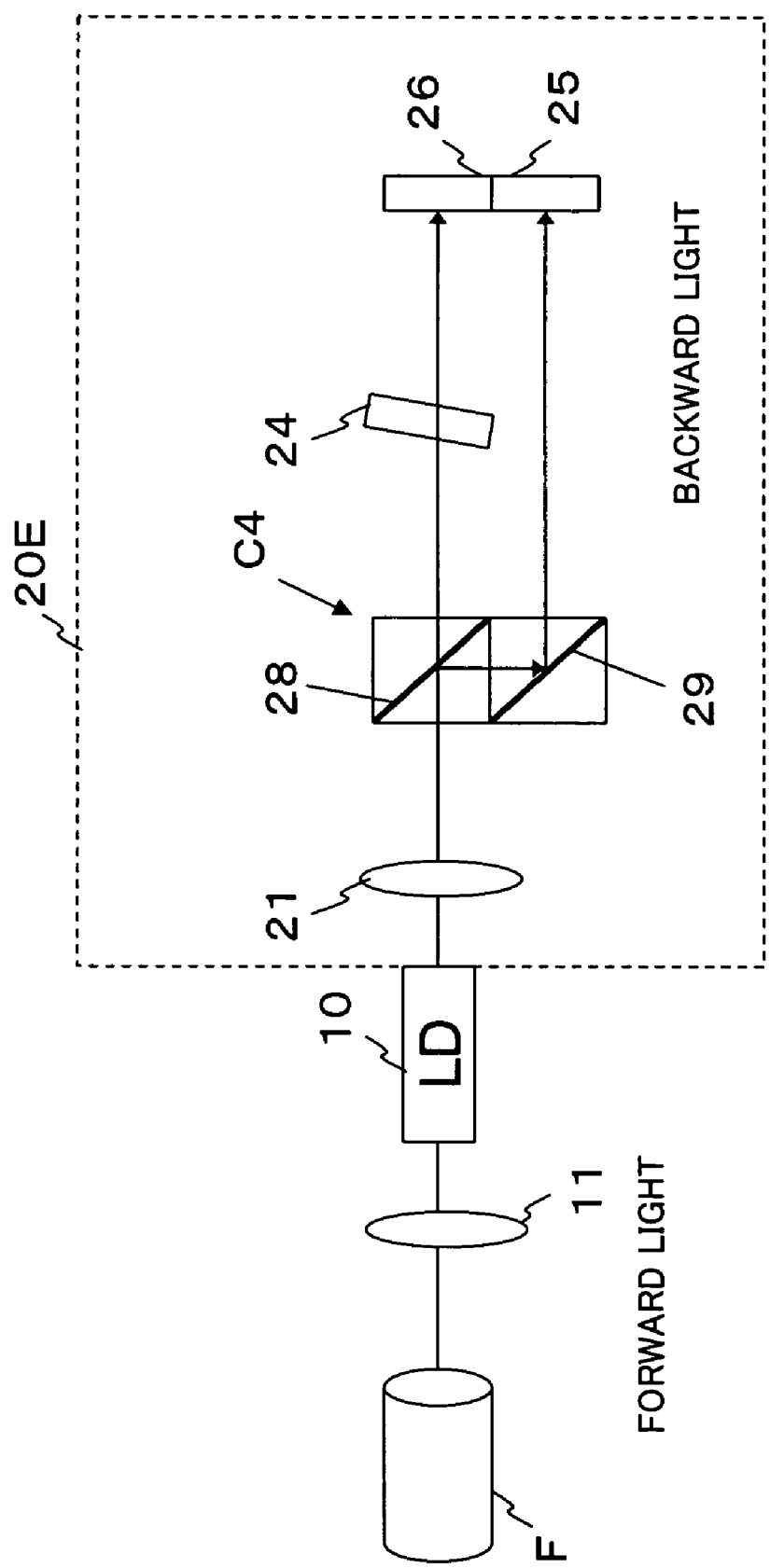
FIG. 22 is an explanatory diagram of Modification 1 of the wavelength locker according to the sixth embodiment, and shows an example in which a half mirror and a total reflecting mirror which are shown in FIG. 21 are integrated.
Figure 23:
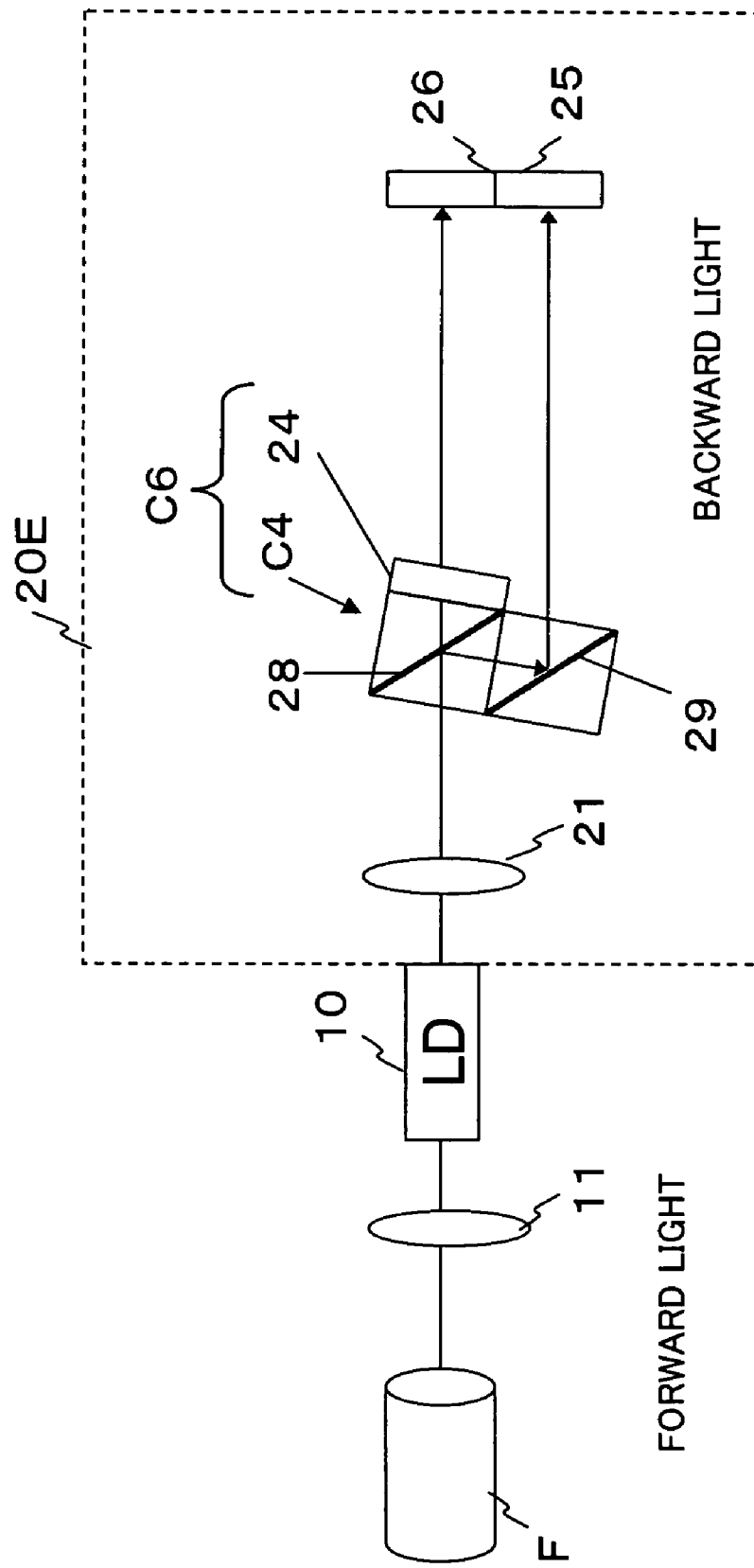
FIG. 23 is an explanatory diagram of Modification 2 of the wavelength locker according to the sixth embodiment, and shows an example in which the half mirror, the total reflecting mirror, and an etalon filter which are shown in FIG. 21 are integrated and tilted.

The wavelength locker 20E can be modified in the same way as the wavelength locker 20D. For example, the etalon filter 24 may be inserted in the optical path of light reflected by the total reflecting mirror 29. Alternatively, to the wavelength locker 20E, the component C4, described in the fifth embodiment, can be applied (FIG. 22), or a component C6 in which the component C4 and the etalon filter 24 are integrated can be applied (FIG. 23).

As described above, according to the first to sixth embodiments, the space optical system of a wavelength locker can be considerably reduced in size. Therefore, the wavelength locker which can be mounted only to a 14pin butterfly LD module in the conventional techniques can be incorporated in the TOSA LD-module.

[Others]

The embodiments described above disclose the inventions recited in claims. The claimed inventions can be appropriately combined as necessary.

The disclosures of Japanese patent application No. JP2006-229708 filed on Aug. 25, 2006 including the specification, drawings and abstract are incorporated herein by reference.

What is claimed is:

1. A wavelength locker, comprising:
a birefringent plate separating light emitted from a light source into two beams of light which are approximately in parallel to each other;
a first light receiving element directly receiving one of the two beams of light separated by the birefringent plate;
a polarizing element and a filter element through which other one of the two beams of light separated by the birefringent plate passes; and
a second light receiving element receiving the other one of the two beams of light which has passed through the filter element, wherein the first light receiving element and the second light receiving element are arranged parallel to each other, and
wherein the polarizing element changes a polarization direction of light reflected by the filter element and incident on the polarizing element such that the reflected light does not return to the light source after passing through the birefringent plate, and emits a resultant light, and
wherein the other one of the two beams of light emitted from the birefringent plate has a same axis that the light emitted from the light source to the birefringent plate has, and the reflected light entering from the polarization element to the birefringent plate has the same axis that the light emitted from the light source to the birefringent plate has, and the reflected light entered in the birefringent plate is emitted from the birefringent plate as a light having an axis parallel to the light emitted from the light source without being separated in the birefringent plate.

2. The wavelength locker according to claim 1, in which the birefringent plate, the polarizing element, and the filter element are integrated.

3. The wavelength locker according to claim 2, in which the birefringent plate, the polarizing element, and the filter element, which are integrated, are tilted with respect to an optical axis of the light emitted from the light source.

4. A wavelength locker according to claim 1, further comprising a second polarizing element disposed between the light source and the birefringent plate, changing a polarization direction of the light, which has been emitted from the light source, reflected by the birefringent plate, and incident on the second polarizing element, to a direction perpendicular to the polarization direction of the emitted light, and emitting resultant light.

5. A wavelength locker according to claim 4, in which the second polarizing element, the birefringent plate, the polarizing element, and the filter element are integrated.

6. A wavelength locker according to claim 5, in which the second polarizing element, the birefringent plate, the polarizing element, and the filter element, which are integrated, are tilted with respect to an optical axis of the light emitted from the light source.

7. A wavelength locker according to claim 4, in which the second polarizing element is formed to have a size which does not allow reflected light of the other one of the two beams of light, which has passed through the polarizing element and the birefringent plate, to be incident on the second polarizing element.

8. A wavelength locker according to claim 4, in which the second polarizing element is a $\lambda/4$ plate having an optic axis tilted at 45 degrees with respect to a polarization direction of light incident on the second polarizing element.

9. A wavelength locker according to claim 8, in which the polarizing element is a $\lambda/4$ plate having an optic axis tilted at 45 degrees with respect to a polarization direction of light incident on the polarizing element.

10. A wavelength locker according to claim 1, in which the birefringent plate has an optic axis tilted at 45 degrees with respect to a polarization direction of light incident on the birefringent plate; and
the polarizing element is a $\lambda/4$ plate having an optic axis tilted at 45 degrees with respect to a polarization direction of light incident on the polarizing element.

* * * * *